United States Patent
Gopalan et al.

(10) Patent No.: US 9,401,472 B1
(45) Date of Patent: Jul. 26, 2016

(54) PROGRAMMABLE IMPEDANCE ELEMENTS AND DEVICES THAT INCLUDE SUCH ELEMENTS

(75) Inventors: Chakravarthy Gopalan, Santa Clara, CA (US); Antonio R. Gallo, San Jose, CA (US); Yi Ma, Santa Clara, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 682 days.

(21) Appl. No.: 13/242,391

(22) Filed: Sep. 23, 2011

Related U.S. Application Data

(60) Provisional application No. 61/385,739, filed on Sep. 23, 2010.

(51) Int. Cl.
*H01L 45/00* (2006.01)
*H01L 29/41* (2006.01)
*G11C 13/00* (2006.01)

(52) U.S. Cl.
CPC ............ *H01L 45/00* (2013.01); *G11C 13/0009* (2013.01); *G11C 13/0011* (2013.01); *H01L 45/085* (2013.01)

(58) Field of Classification Search
CPC ............ H01L 45/085; G11C 13/0009; G11C 13/0011
USPC ............... 257/1, 2, 3, 4, 5, E45.001, E45.002
See application file for complete search history.

(56) References Cited

U.S. PATENT DOCUMENTS

| | | | |
|---|---|---|---|
| 5,761,115 A | 6/1998 | Kozicki et al. | |
| 6,487,106 B1 | 11/2002 | Kozicki | |
| 6,635,914 B2 | 10/2003 | Kozicki et al. | |
| 6,825,489 B2 | 11/2004 | Kozicki | |
| 6,927,411 B2 | 8/2005 | Kozicki | |
| 6,985,378 B2 | 1/2006 | Kozicki | |
| 7,101,728 B2 | 9/2006 | Kozicki et al. | |
| 7,294,875 B2 * | 11/2007 | Kozicki | ......... 257/243 |
| 7,307,868 B2 | 12/2007 | Symanczyk | |
| 7,332,377 B2 | 2/2008 | Happ et al. | |
| 7,368,314 B2 | 5/2008 | Ufert | |
| 7,372,065 B2 | 5/2008 | Kozicki et al. | |
| 7,385,219 B2 | 6/2008 | Kozicki et al. | |
| 7,560,722 B2 * | 7/2009 | Kozicki | ............ 257/4 |
| 7,560,724 B2 | 7/2009 | Aratani et al. | |
| 7,696,511 B2 | 4/2010 | Ohba et al. | |
| 7,700,398 B2 | 4/2010 | Pinnow | |
| 7,718,537 B2 | 5/2010 | Ufert | |
| 7,728,322 B2 | 6/2010 | Kozicki | |

(Continued)

*Primary Examiner* — Jerome Jackson, Jr.
*Assistant Examiner* — Paul Budd

(57) ABSTRACT

Programmable impedance elements structures, devices and methods are disclosed. Methods can include: forming a first electrode layer within an electrode opening that extends through a cap layer; planarizing to expose a top of the cap layer; cleaning the exposed top surface of the cap layer to remove residual species from previous process steps. Additional methods can include forming at least a base ion conductor layer having an active metal formed therein that may ion conduct within the ion conductor layer; and forming an inhibitor material that mitigates agglomeration of the active metal within the base ion conductor layer as compared to the active metal alone. Programmable impedance elements and/or devices can have switching material and electrodes parallel to both bottoms and sides of a cell opening formed in a cell dielectric. Other embodiments can include an ion conductor layer having an alloy of an active metal, or two ion conductor layers in contact with an active electrode.

16 Claims, 24 Drawing Sheets

(56) References Cited

U.S. PATENT DOCUMENTS

| | | | |
|---|---|---|---|
| 7,989,924 B2 * | 8/2011 | Sakamoto | H01L 45/085 257/E31.029 |
| 8,134,139 B2 * | 3/2012 | Lin et al. | 257/4 |
| 8,168,468 B2 * | 5/2012 | Mathew | H01L 45/085 257/E31.029 |
| 8,426,839 B1 | 4/2013 | Ma et al. | |
| 8,519,377 B2 * | 8/2013 | Sumino | H01L 43/08 257/5 |
| 8,541,765 B2 * | 9/2013 | Marsh | H01L 27/101 257/4 |
| 2003/0047765 A1 * | 3/2003 | Campbell | H01L 45/085 257/298 |
| 2009/0034318 A1 * | 2/2009 | Iguchi | 365/129 |

\* cited by examiner

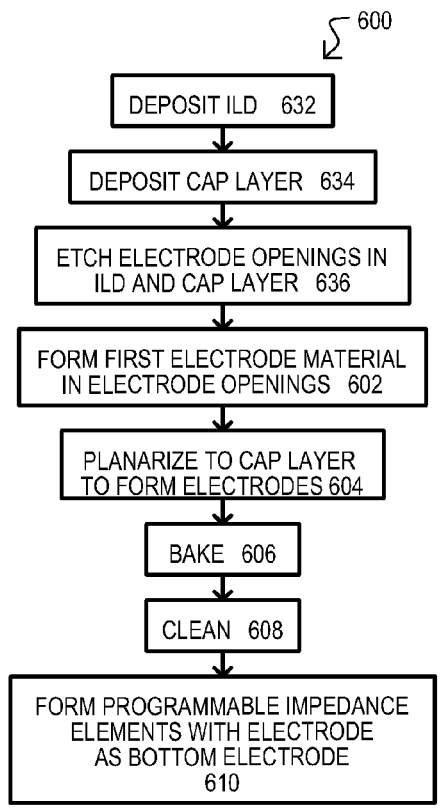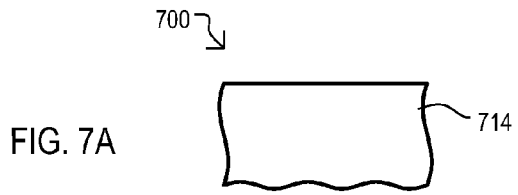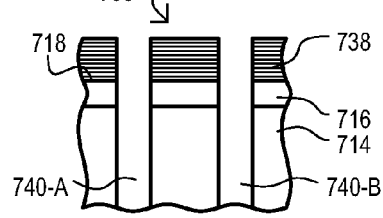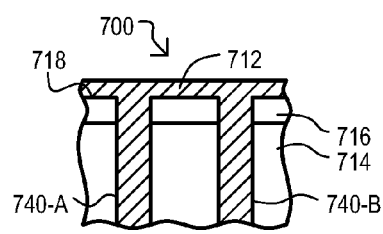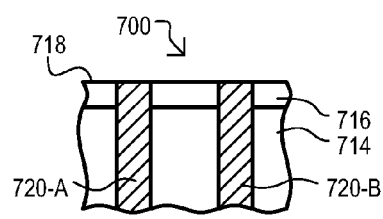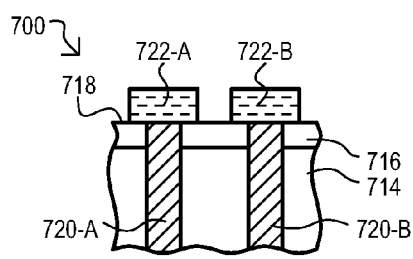

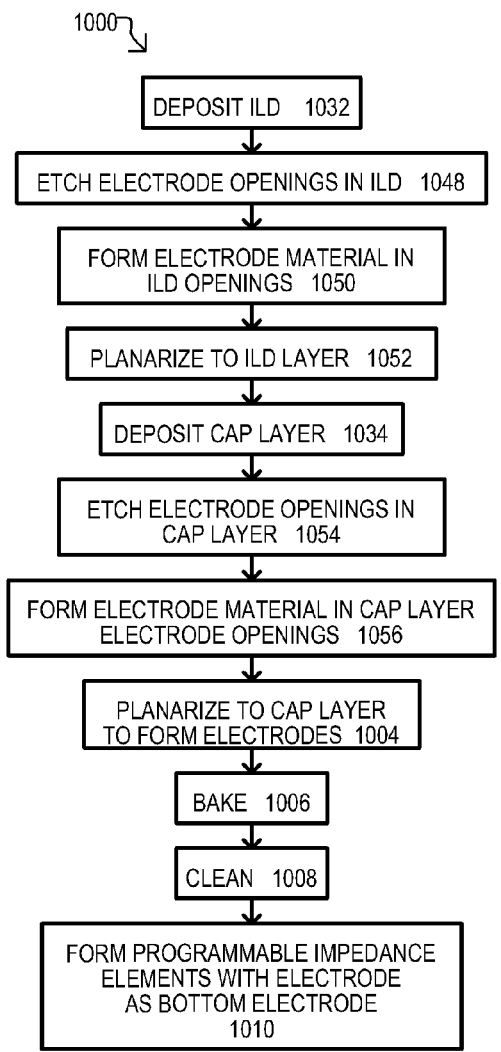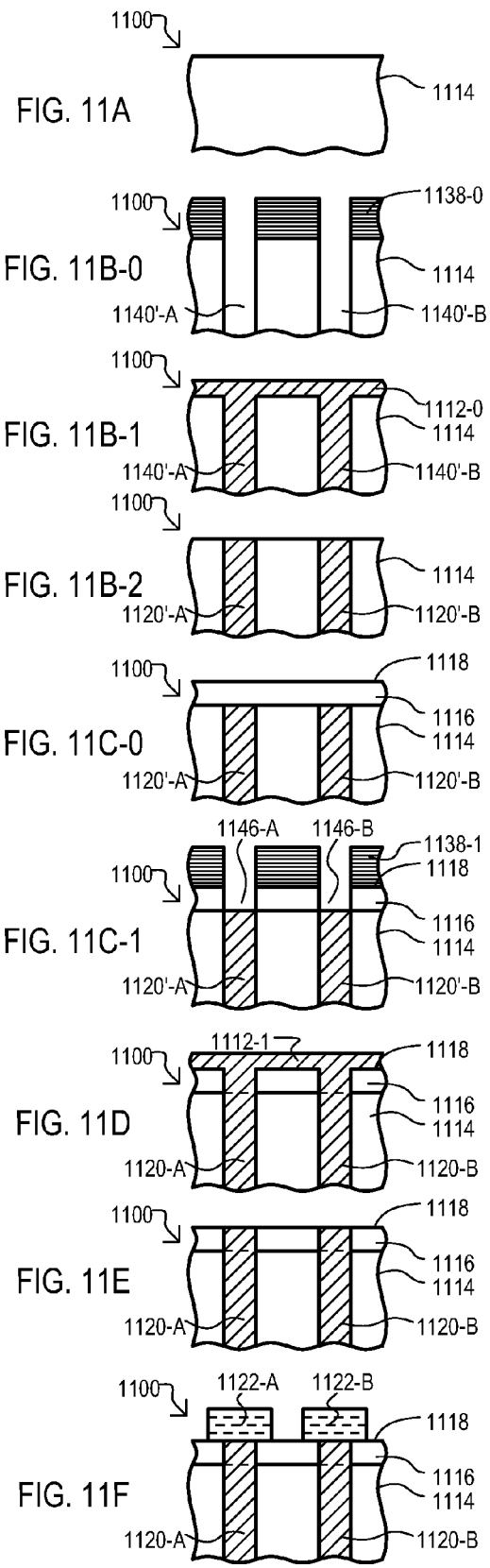
FIG. 10
FIG. 11A
FIG. 11B-0
FIG. 11B-1
FIG. 11B-2
FIG. 11C-0
FIG. 11C-1
FIG. 11D
FIG. 11E
FIG. 11F

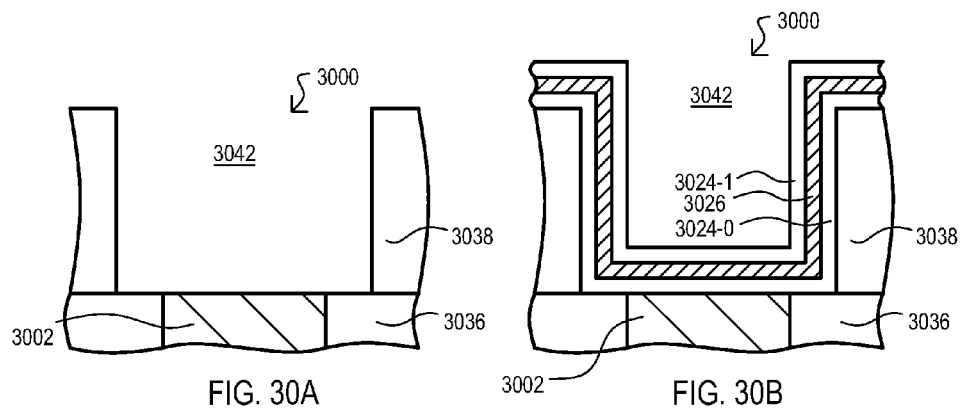
FIG. 30A
FIG. 30B
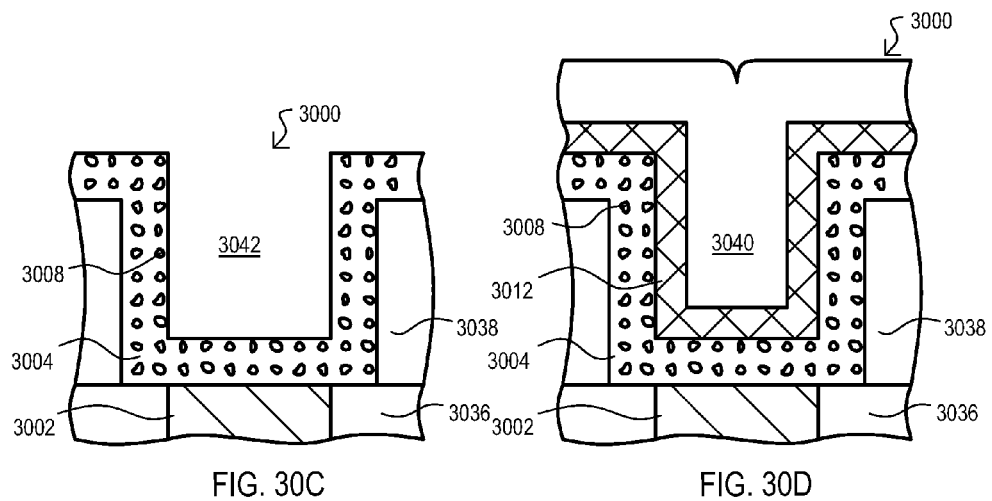
FIG. 30C
FIG. 30D
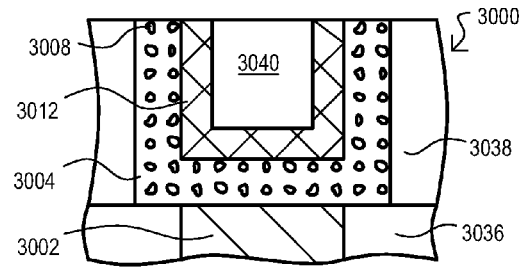
FIG. 30E

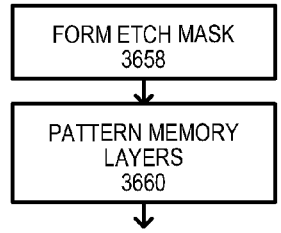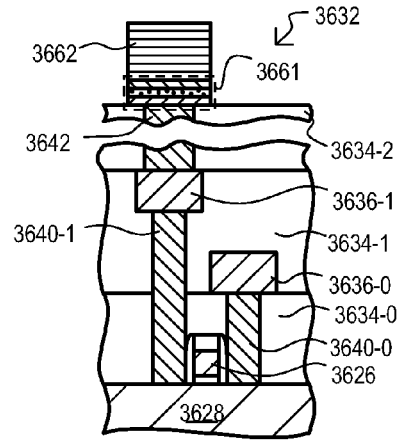
FIG. 36E
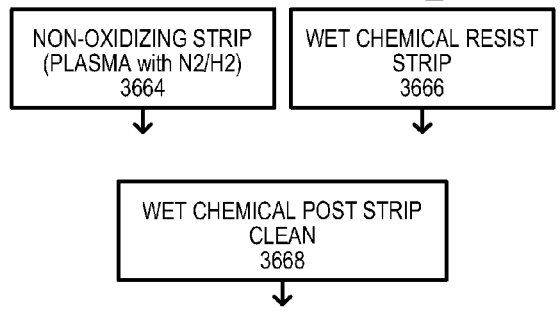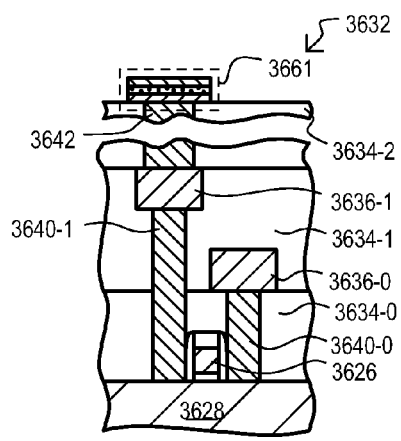
FIG. 36F
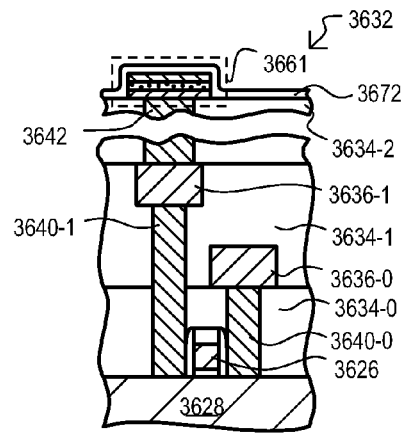
FIG. 36G

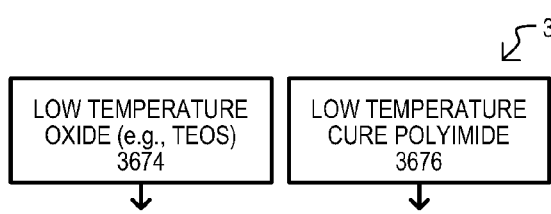
FIG. 36H
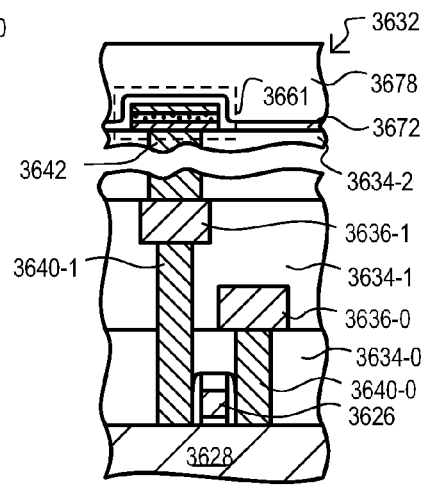
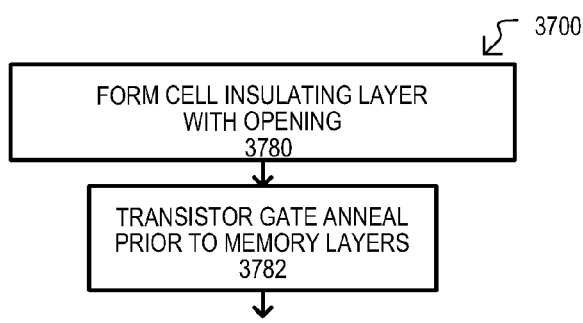
FIG. 37A
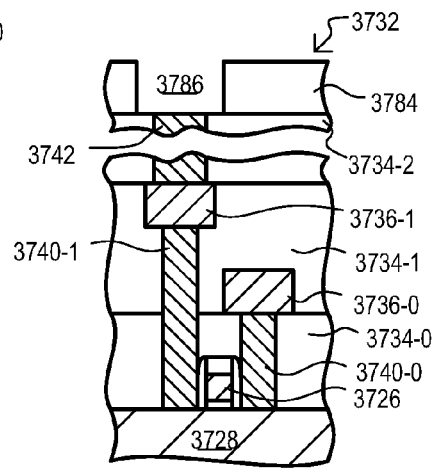

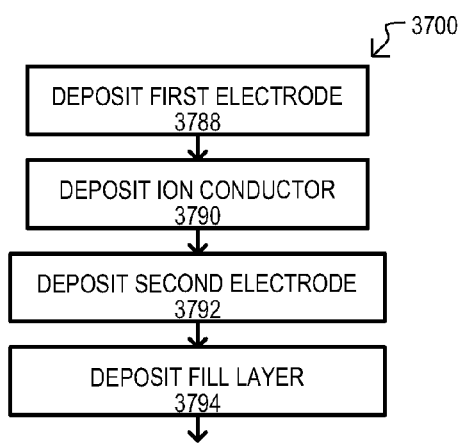
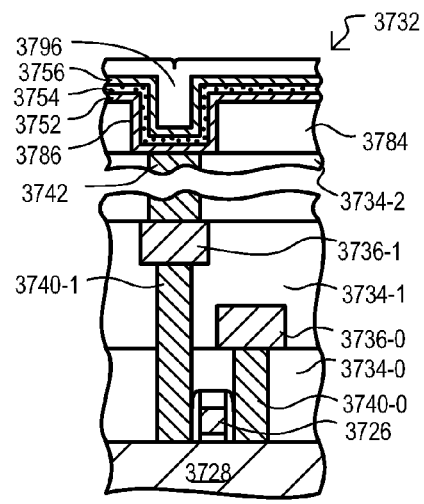
FIG. 37B
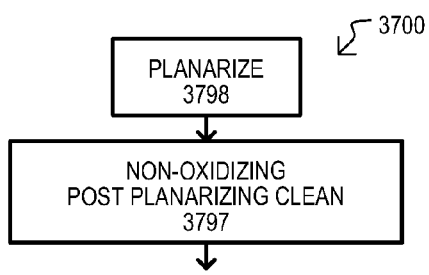
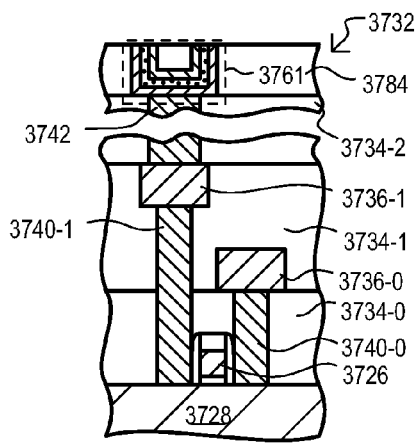
FIG. 37C
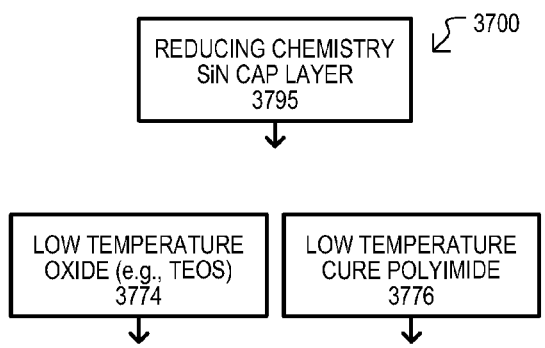
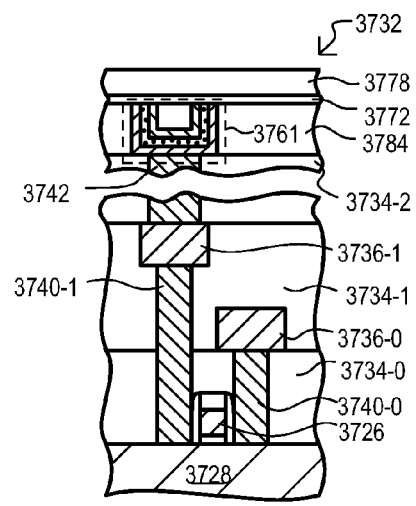
FIG. 37D

PROGRAMMABLE IMPEDANCE ELEMENTS AND DEVICES THAT INCLUDE SUCH ELEMENTS

This application claims the benefit of U.S. Provisional Patent Application Ser. No. 61/385,739, filed on Sep. 23, 2010, the contents of which are incorporated by reference herein.

TECHNICAL FIELD

The present invention relates generally to memory elements for storing data in an integrated circuit device, and more particularly to programmable impedance elements, such as conductive bridge random access memory (CBRAM) type devices.

BRIEF DESCRIPTION OF THE DRAWINGS

FIG. 6 is a flow diagram showing a method of fabricating a programmable impedance device having a cap layer according to another embodiment.

FIGS. 7A to 7F are a series of side cross sectional views showing a method like that of FIG. 6.

FIG. 10 is a flow diagram showing a method of fabricating a programmable impedance device having a bottom electrode with separate portions in a cap layer according to another embodiment.

FIGS. 11A to 11F are a series of side cross sectional views showing a method like that of FIG. 10.

FIGS. 30A to 31 are a series of side cross sectional views showing a method of forming a programmable impedance memory element according to an embodiment.

FIG. 31 is a side cross sectional view of a programmable impedance memory element according to an embodiment.

FIGS. 36A to 36H are a sequence of diagrams showing a method of forming a programmable impedance memory device according to an embodiment.

FIGS. 37A to 37D are a sequence of diagrams showing a method of forming a programmable impedance memory device according to another embodiment.

DESCRIPTION OF EMBODIMENTS

Embodiments of the invention show methods for forming a bottom electrode for programmable impedance elements. In very particular embodiments a programmable impedance element may be a programmable metallization cell (PMC) (also called a conductive bridging random access memory, or CBRAM cell), having an ion conductor material formed between a bottom electrode and a top electrode. Resulting structures created by such methods are also shown.

Figure 1:
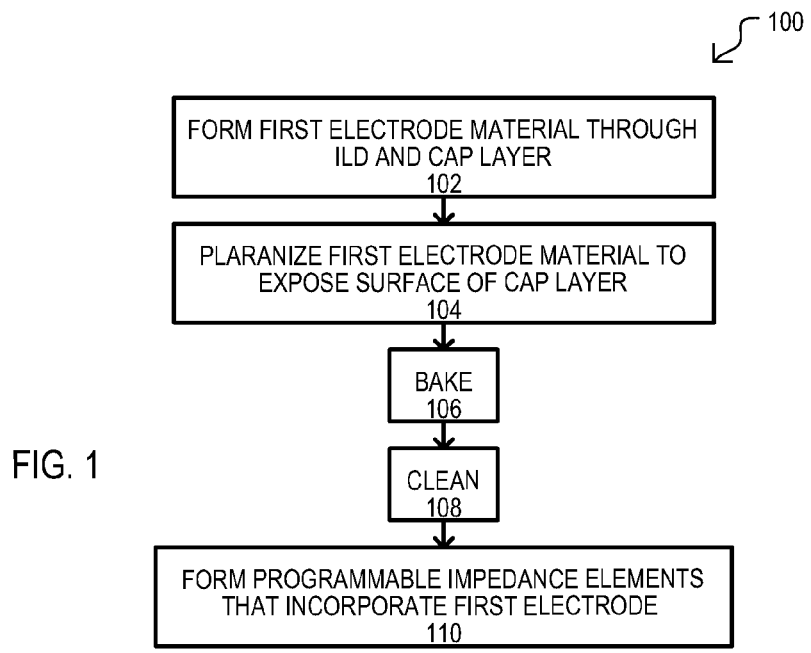
FIG. 1 is a flow diagram showing a method of fabricating a programmable impedance device having a cap layer according to an embodiment.

FIG. 1 shows one example of a method 100 of manufacturing a programmable impedance device with programmable impedance elements (hereinafter programmable element) according to one embodiment. A method 100 may include forming a first electrode material through a dielectric layer and a cap layer (102).

A first electrode material may be a conductive material suitable as an electrode for a programmable element. As but one example, a programmable element may be PMC and a first electrode material may form an "indifferent" bottom electrode (i.e., an electrode that does not contribute ions to an ion conductor layer). Alternatively, a first electrode may form an "active" electrode (i.e., an electrode that does contribute ions to an ion conductor layer). In the former case, a first electrode material may be selected to provide a predetermined contact potential and/or chemical potential at a junction between the electrode and a switching material (e.g., ion conductor) of the programmable element. In very particular examples, a first electrode material may include tantalum (Ta), titanium (Ti), tungsten (W), titanium nitride (TiN), or combinations thereof.

A dielectric layer may be an "inter-layer dielectric" (ILD). An ILD may provide electrical isolation between conductive layers of an integrated circuit. As but one example, an ILD may provide isolation between active devices (e.g., transistors) and an overlying interconnect layer, or may provide insulation between an interconnect layer and memory elements, or may provide insulation between two interconnect layers.

A cap layer may be a dielectric layer having different properties than the corresponding dielectric layer. In one embodiment, a cap layer can protect a dielectric layer from mobile species that could otherwise propagate through the dielectric layer and adversely affect other structures below (e.g., transistors). In addition or alternatively, a cap layer may protect other layers of a programmable element (those formed over bottom electrode) from species present in lower layers.

In a very particular embodiment a cap layer material may be selected to protect underlying layers from mobile ion species (e.g., silver (Ag) and/or copper (Cu)) present in a programmable element, or species present in an interconnect layer formed in contact with a programmable element.

A method 100 may further include planarizing the first electrode material to expose a top surface of the cap layer (104). Unlike conventional approaches, such an action may include more than one planarization operation to form surface features having lower mechanical stress, fewer defects, and/or lower resulting electric fields when a finished device is in operation. Such a planarization step may form a bottom electrode having a top surface substantially coplanar with a top surface of cap layer.

A method 100 may also include a post-planarization bake (106) and clean (108). A bake (106) may include subjecting the structure to a heat treatment step. Such a step may cause unwanted species to evaporate from a resulting structure, or provide the energy necessary for unwanted species to propagate to a top surface of the cap layer (or first electrode). In particular embodiments, a bake can include subjecting a device (e.g., multiple partially formed integrated circuits on a semiconductor substrate wafer) to a temperature in the range of 1 to 800° C. for a time period in the range of 1 to 30 minutes.

A clean (108) may remove unwanted species away from exposed top surfaces, and may include rinses of de-ionized water, chemical rinses, or other suitable removal methods, including but not limited to plasma etching. Unwanted species may include elements, molecules that have been adsorbed, chemisorbed or embedded from previous process steps, and that may cause defects or otherwise affect device reliability by reacting with subsequently formed layers.

A method 100 may further include forming a programmable element that incorporates the first electrode (110). Such an operation may include forming and/or patterning remaining layers of a programmable element that includes the first electrode. As but one very particular example, such an operation may form an ion conductor layer and second electrode to complete a PMC structure that incorporates the first electrode as a bottom electrode.

In this way, a programmable impedance element can be formed that includes an insulating cap layer to prevent migration of mobile species between the programmable impedance elements and lower layers. Further, a surface may be prepared with baking and cleaning steps to remove species that can adversely affect device performance and/or reliability.

Figure 2A:
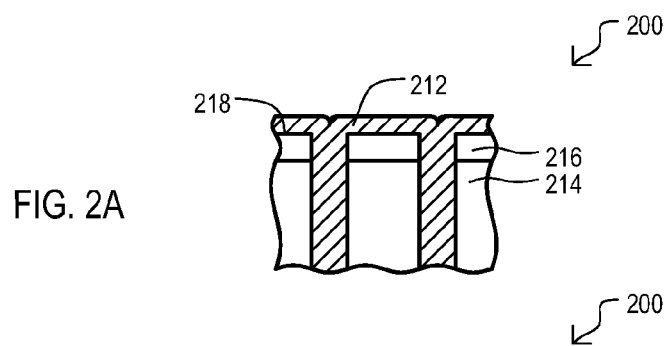
FIGS. 2A to 2C are a series of side cross sectional views showing a method like that of FIG. 1.
Figure 2B:
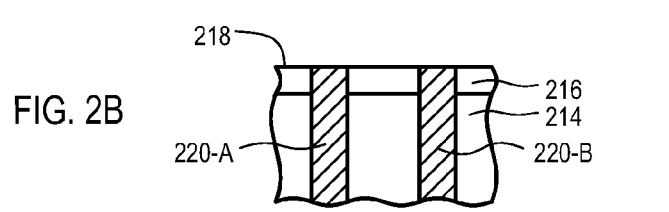
Figure 2C:
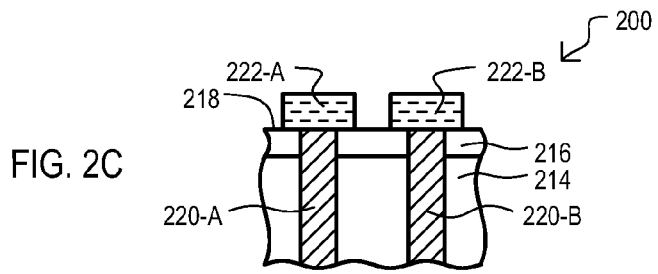

FIGS. 2A to 2C show one example of the formation of two programmable elements according to a method 100 like that of FIG. 1.

FIG. 2A shows a device 200 following step (102) of FIG. 1. A first electrode layer 212 has been formed through a dielectric layer 214 and a cap layer 216. In the embodiment shown, a portion of first electrode layer 212 can remain on a cap layer top surface 218.

FIG. 2B shows a device 200 following step (104) of FIG. 1. A planarization step can expose a cap layer top surface 218, resulting in the formation of first electrodes 220-A/B having top surfaces substantially coplanar with cap layer top surface 218.

FIG. 2C shows a device 200 following step (110) of FIG. 1. Cell portions 222-A/B have been formed over and in contact with bottom electrodes 212-A/B, respectively. Cell portions 222-A/B, in combination with corresponding bottom electrode 212-A/B, may each form a separate programmable element. In one very particular embodiment, bottom electrodes 212-A/B may be indifferent electrodes of PMCs, and bottom electrodes 212-A/B can have a conductive connection to active devices (e.g., transistors, not shown). In particular embodiments, cell portions 222-A/B can include an ion conductor layer and an active electrode.

Figure 3:
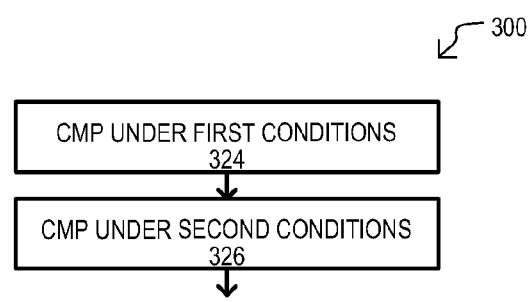
FIG. 3 is a flow diagram showing chemical mechanical polishing (CMP) that can be included in embodiments.

FIG. 3 shows one example of a planarization method 300 that may be one example of that shown as 104 in FIG. 1. A planarization method 300 may include separate chemical mechanical polishing (CMP) steps 324 and 326 under different conditions. Different conditions may include, but are not limited to, different slurry compositions (or absence of a slurry), pad types, or chemicals utilized. In one very particular example, a second CMP 326 may be a "buff" operation that utilizes a substantially unreactive solution, such as de-ionized water, and no slurry or an ultra-fine slurry.

Such multiple planarization operations may increase a planarity of an electrode with respect to a top surface of a cap layer. Such increased flatness may reduce stress and hence reduce defects. In addition or alternatively, such multiple planarization operations may control surface features to mitigate stress concentrators and/or sharp corners that may produce high local electric fields during the operation of a finished device.

Figure 4A:
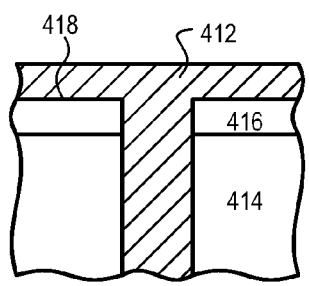
FIGS. 4A to 4C are a series of side cross sectional views showing a CMP operation like that of FIG. 3.
Figure 4B:
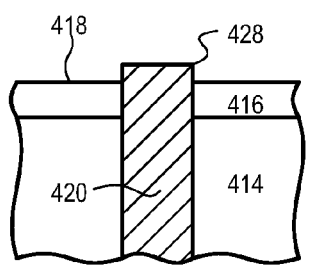
Figure 4C:
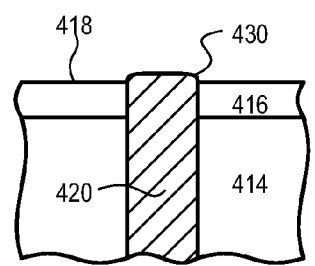

FIGS. 4A to 4C show an example of a two step planarization like that of FIG. 3 according to one very particular embodiment.

FIG. 4A shows a device prior to a first planarization step. A first electrode layer 412 *m* may extend through a dielectric layer 414 and a cap layer 416 and have portions on a cap layer top surface 418.

FIG. 4B shows a device after a first planarization step (e.g., 324 of FIG. 3). A first planarization step may be optimized to remove first electrode layer 412 from a cap layer top surface 418, and hence may result in portion of a resulting first electrode 420 extending above a cap layer top surface 418. Further, a first electrode 420 may have relatively sharp edges (one shown as 428).

FIG. 4C shows a device after a second planarization step (e.g., 326 of FIG. 3) under different conditions than the first planarization step. A second planarization step may be optimized to reduce features that may cause defects or adversely affect device performance. In the very particular example of FIGS. 4A to 4C, a second planarization step may result in a first electrode 420 having more rounded edges 430.

Figure 5A:
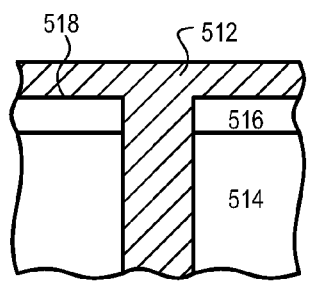
FIGS. 5A to 5C are a series of side cross sectional views showing another CMP operation like that of FIG. 3.
Figure 5B:
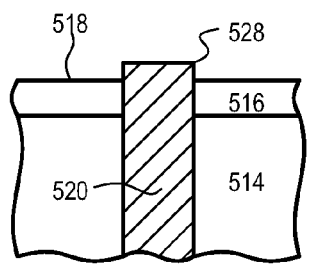
Figure 5C:
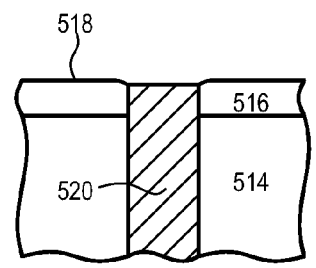

FIG. 5A to 5C show another example of a two step planarization like that of FIG. 3 according to one very particular embodiment. FIGS. 5A and 5B show substantially the same features as FIGS. 4A and 4B.

FIG. 5C shows a device after a second planarization step (e.g., 326 of FIG. 3) under different conditions than the first planarization step. In the very particular example of FIGS. 4A to 4C, a second planarization step may result in increased planarity between a top surface of first electrode 520 and a cap layer top surface 518.

FIGS. 6 and 7A to 7F show methods according to other embodiments. FIG. 6 is a flow diagram of a method. FIGS. 7A to 7F are side cross sectional views of a device showing one example of the method of FIG. 6. The method of FIG. 6 may be one particular example of any of the methods shown in FIGS. 1 to 5C.

A method 600 may include depositing an ILD (632). Such a step may include depositing an insulating film including but not limited to silicon dioxide, including undoped forms and/or doped forms such a phosphosilicate glass (PSG) or borophosphosilicate glass (BPSG). In addition or alternatively, an ILD may include silicon nitride, or silicon oxynitride. In one particular embodiment, an ILD may be undoped silicon dioxide formed by the decomposition of tetraethylorthosilicate (TEOS), formed over a substrate containing active devices (e.g., transistors).

FIG. 7A shows one example of a device 700 following the deposition of an ILD 714.

A method 600 may also include depositing a cap layer (634). A cap layer may be formed from an insulating material having different contamination mobility properties than the ILD with respect to targeted species (i.e., species intended to be blocked from migrating between the cap layer and ILD). In particular embodiments, a cap layer may include materials different than the ILD. In one particular embodiment, an ILD may be undoped silicon dioxide and a cap layer may include silicon nitride, silicon oxynitride, or a combination thereof.

FIG. 7B shows one example of a device 700 after the formation of a cap layer 716. Cap layer 716 may be formed directly on a top surface of ILD 714, resulting in a cap layer top surface 718.

A method 600 may further include etching electrode openings in ILD and cap layers (636). Such a step may include forming an etch mask on a top surface of a cap layer, and then etching through the cap layer and underlying ILD in a single etch step, or multiple etch steps. In one particular embodiment, an etching step may include reactive ion etching and resulting electrode openings may expose connections to underlying active devices (not shown). For example, etched electrode openings may expose an underlying interconnect pattern, or a substrate surface containing active devices.

FIG. 7C shows one example of a device 700 after a step 636. An etch mask 738 may be formed on a cap layer top surface 718 having openings at desired locations of electrodes. In particular embodiments, an etch mask may be formed by developing a photoresist or with other suitable photolithographic techniques. A resulting etching operation may create electrode openings 740-A/B that extend through cap layer 716 and ILD 714.

A method 600 may further include forming first electrode material in electrode openings (602). In some embodiments, such a step can include actions like those noted for step 102, or an equivalent. FIG. 7D shows one example of a device 700 after a step 602. A first electrode material 712 can be formed within electrode openings 740-A/B and extend above a top surface of cap layer 718.

A planarization to a cap layer to form electrodes (604) can occur. In some embodiments, such a step can include actions like those noted for step 104, or an equivalent. In particular embodiments, a planarization step 604 can include operations shown in any of FIGS. 3 to 5C. FIG. 7E shows one example of a device 700 after a step 604. A first electrode material 718 above a top surface of cap layer 716 can be removed. Electrodes 720-A/B have been created that extend through cap layer 716 and ILD 714.

A method 600 can further include a bake (606) and clean (608). In some embodiments, a bake (606) can include actions like those noted for step 106, or an equivalent. Similarly, in particular embodiments, a clean (608) can include actions like those noted for step 108, or an equivalent.

Programmable impedance elements can then formed with the electrodes as bottom electrodes (610). In some embodiments, such a step can include actions like those noted for step 110, or equivalents. FIG. 7F shows one example of device 700 after a step 610. Programmable impedance structures 722-A/B can be formed over and in contact with electrodes 720-A/B, which can serve as all, or part of a bottom electrode for a corresponding programmable impedance element. In some embodiments, a programmable impedance layer, such as a solid electrolyte, can be in direct contact with electrodes 720-A/B. However, in other embodiments, there may be one or more intervening layers between a programmable impedance layer and electrodes 720-A/B. Such intervening layers can include, but are not limited to, insulating and/or conductive layers.

Figure 8:
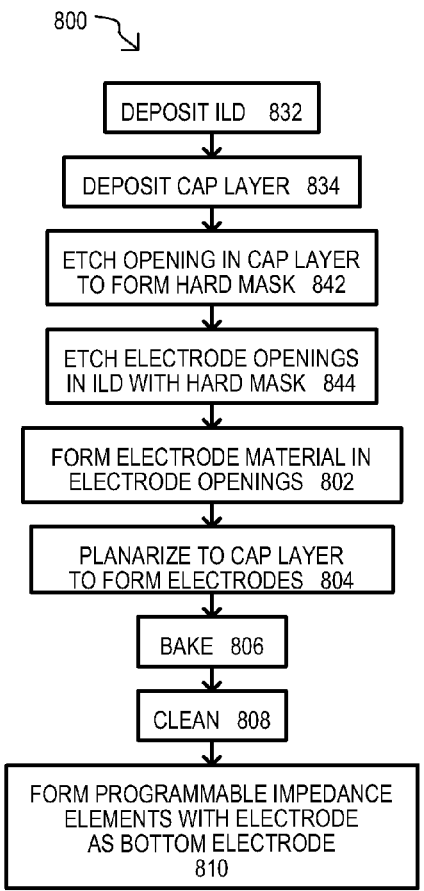
FIG. 8 is a flow diagram showing a method of fabricating a programmable impedance device having a hard mask cap layer according to another embodiment.

FIGS. 8 and 9A to 9F show method according to further embodiments. FIG. 8 may include steps like those of FIG. 6. Such like steps are referred to by the same reference character but with the first digit being an "8" instead of a "6".

Figure 9A:
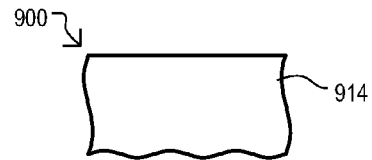
FIGS. 9A to 9F are a series of side cross sectional views showing a method like that of FIG. 8.
Figure 9B:
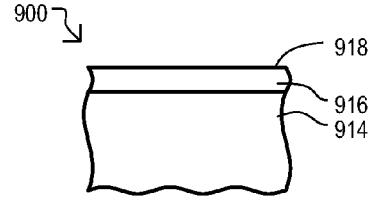
Figures 0, 9C:
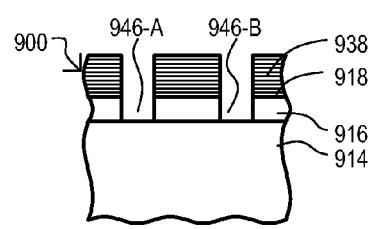
Figures 1, 9C:
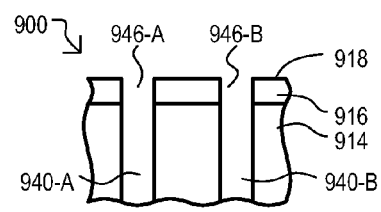
Figure 9D:
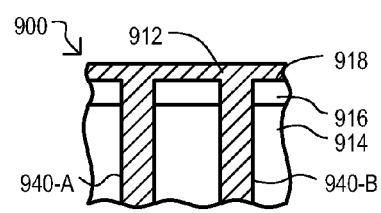
Figure 9E:
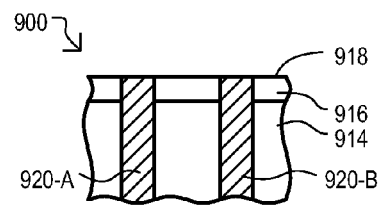
Figure 9F:
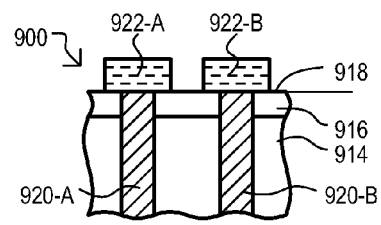

The method of FIG. 8 differs from that of FIG. 6 in that electrode openings may be formed by a two step process that utilizes a cap layer 916 as a hard etch mask. Accordingly, a method 800 may include etching openings in the cap layer to form a hard mask (842). FIG. 9C-0 shows one example of a device 900 after a step 842. An etch mask 938 may be formed on a cap layer top surface 918 having openings at desired locations of electrodes. A resulting etching operation may create openings 946 through cap layer 916 but not significantly into ILD 914.

A method 800 may also include etching electrode openings in ILD with the hard mask (844). Prior to such a step, an etch mask 938 is removed. FIG. 9C-1 shows one example of a device 900 after a step 844. An etch mask 938 is removed, and electrode openings 940-A/B may be formed through ILD 914 using a patterned cap layer as a hard mask.

FIGS. 10 and 11A to 11F show further methods according to embodiments. FIG. 10 may include steps like those of FIG. 6. Such like steps are referred to by the same reference character but with the first digits being a "10" instead of a "6".

The method of FIG. 10 differs from that of FIG. 6 in that electrode openings may be formed having multiple portions.

Referring to FIG. 10, a method 1000 may include etching openings in an ILD prior to forming a cap layer (1048). FIG. 11B-0 shows one example of a device 1100 after a step 1048. A first etch mask 1138-0 may be formed on a top surface of ILD 1118 having openings at desired locations of electrodes. A resulting etching operation may create openings 1140'-A/B through ILD 1114.

A method 1000 may also include forming electrode material within ILD openings (1050). In some embodiments, such a step may include actions like those described for step 102 of FIG. 1, or equivalents. FIG. 11B-1 shows one example of a device 1100 following step (1050) of FIG. 10. A first electrode layer 1112-0 has been formed through ILD 1114. A portion of first electrode layer 1112-0 can remain on a top surface of ILD 1114.

Method 1000 may further include planarizing to the ILD layer (1052). In some embodiments, such a step may include actions like those described for step 104 of FIG. 1 and any of FIGS. 3 to 5C. FIG. 11B-2 shows one example of a device 1100 following step (1052) of FIG. 10. A planarization step has exposed a top surface of ILD 1114, resulting in the formation of first electrode portions 1120'-A/B.

Having formed a portion of first electrodes in the ILD layer, a method 1000 may then deposit a cap layer (1034). Such a step may include actions like those described for step 634 of FIG. 6, or equivalents. FIG. 11C-0 shows one example of a device 1100 following a step 1034. A cap layer 1116 may be formed on a top surface of ILD 1114, and over first electrode portions 1120'-A/B.

A method 1000 may include etching electrode openings in the cap layer (1054). Such action can expose first electrode portions 1120'-A/B within the ILD below. FIG. 11C-1 shows one example of a device 1100 after a step 1140. A second etch mask 1138-1 may be formed on a cap layer top surface 1118 having openings at locations of first electrode portions 1120'-A/B. A subsequent etching may create electrode openings 1146-A/B through cap layer 1116 that expose tops surfaces of first electrode portions 1120'-A/B.

A method 1000 may then form electrode material(s) within cap layer electrode openings (1056). Such a step may include actions like those described for step 102 of FIG. 1. However, a material deposited may be the same as, or different than, the electrode material deposited within openings in the ILD in step 1050. FIG. 11D shows one example of a device 1100 following step (1056) of FIG. 10. A second electrode layer 1112-1 has been formed within cap layer openings 1146 with a portion remaining on a cap layer top surface 1118.

Planarization, bake, clean, and programmable element completion steps may then occur as in the previous embodiments, or equivalents. It is noted that in the embodiment of FIGS. 10 to 11F, a first electrode 1120-A/B may have two portions, one through the ILD 1114, and one through the cap layer 1116.

Figures 12, 13A, 13B, 13C, 13D:
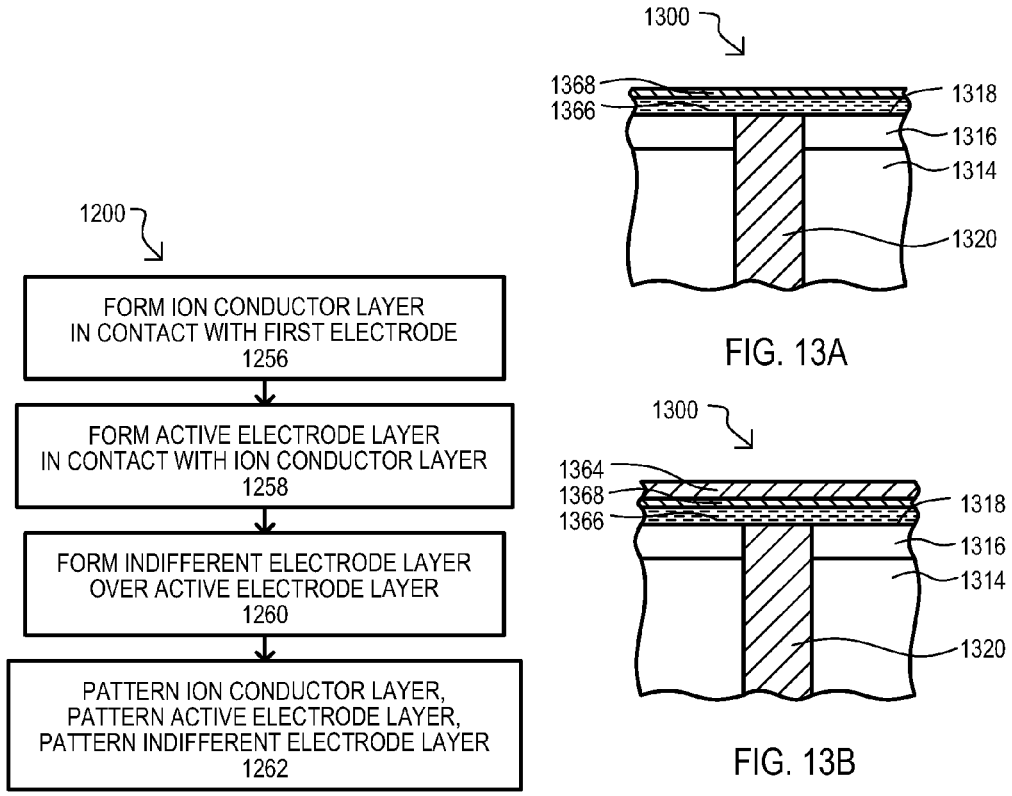
FIG. 12 is a flow diagram showing a method of fabricating a programmable impedance device with planar elements and a cap layer according to another embodiment.
FIGS. 13A to 13D are a series of side cross sectional views showing a method like that of FIG. 12.

FIGS. 12 to 13D show other methods of forming programmable impedance elements that incorporate a first electrode. Such a method may be one example of any of those shown as 110, 610, 810, 1010 in FIGS. 1, 6, 8, and 10, respectively.

The particular embodiment of FIGS. 12 to 13D shows the formation of a PMC as the programmable element. The PMC includes an ion conductor portion and second electrode that are substantially parallel to a top surface of a cap layer.

A method 1200 may include forming an ion conductor layer in contact with a first electrode (1256). It is assumed that a first electrode is an indifferent bottom electrode. Such an action can include depositing one or more solid electrolyte materials having an impedance that can be varied by application of an electric field. In particular embodiments, an ion conductor layer can include any of a chalcogenide or transition metal oxide. In a very particular embodiment, an ion conductor layer can include $GeS_2$.

An active electrode layer may then be formed in contact with the ion conductor layer (1258). An active electrode layer can include one or more conductive elements that can ion conduct through an ion conductor layer. In particular embodiments, an active electrode can include any of silver or copper.

One example of a device 1300 following steps 1256 and 1258 is shown in FIG. 13A. An ion conductor layer 1366 is formed on a cap layer top surface 1318 in contact with first electrode 1320. An active electrode layer 1368 is formed on ion conductor layer 1366. In one very particular embodiment, a first electrode 1320 may include any of Ta, Ti, W, or TiN, individually or in combination, an ion conductor layer 1366 may include any of the materials, noted above for step 1256, or equivalents. An active electrode layer 1368 may include any materials noted above for step 1258, or equivalents.

In the example shown, a method 1200 may then form another indifferent electrode layer over the active electrode layer (1260). One example of a device 1300 following a step 1260 is shown in FIG. 13B. An indifferent conductor layer 1364 is formed on active electrode layer 1368. Such a layer may be formed from Ta, Ti, W, or TiN, or may include other interconnect materials, such as copper (Cu) or aluminum (Al).

A method 1200 may also include patterning the ion conductor layer, active electrode layer, and indifferent electrode layer 1262 to form a PMC that incorporates the first electrode (1262). FIGS. 13C and 13D one example of a patterning step 1262 for device 1300. FIG. 13C shows the formation of a programmable element using an etch mask 1370 over indifferent electrode layer 1364, active electrode layer 1368, and ion conductor layer 1366. FIG. 13D shows a resulting structure after an etching step has etched through exposed portions of layers 1364, 1368 and 1366 to form cell portion 1322. Cell portion 1322 in combination with first electrode 1320 may form a PMC. In one embodiment, all such layers can be etched in a single etch step. However, in alternate embodiments, such layers may be patterned in different steps.

Figure 14:
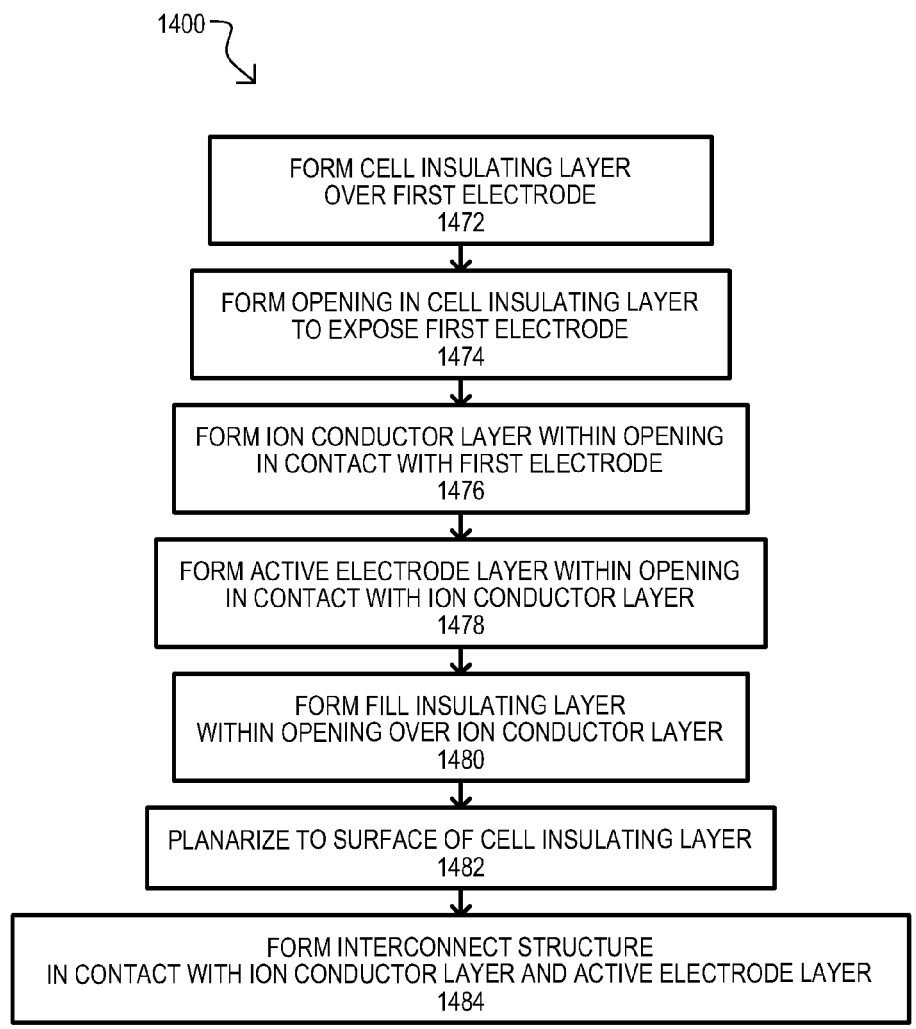
FIG. 14 is a flow diagram showing a method of fabricating a programmable impedance device with elements formed in an opening over a cap layer according to an embodiment.
Figure 15A:
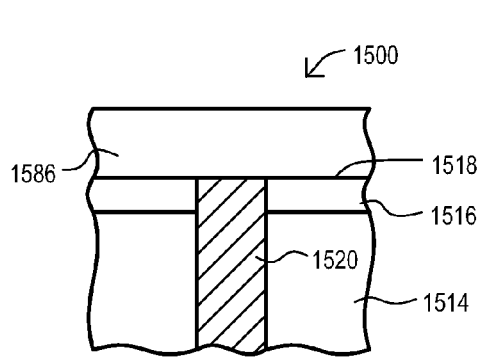
FIGS. 15A to 15G are a series of views showing a method like that of FIG. 14.
Figure 15B:
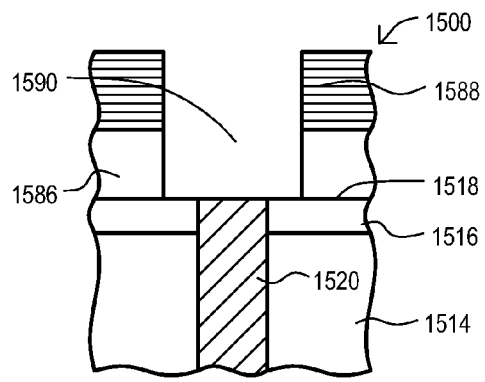
Figure 15C:
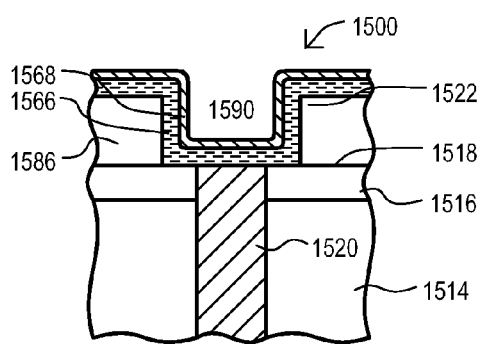
Figure 15D:
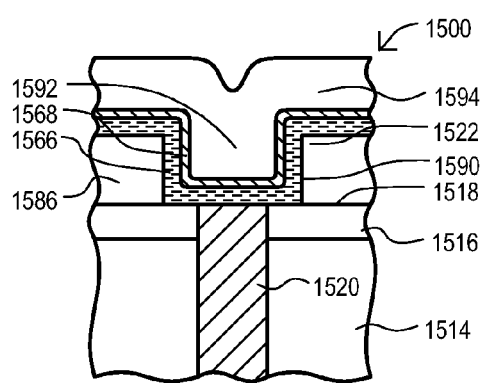
Figure 15E:
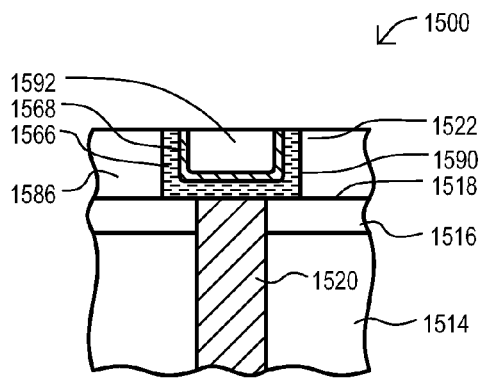
Figure 15F:
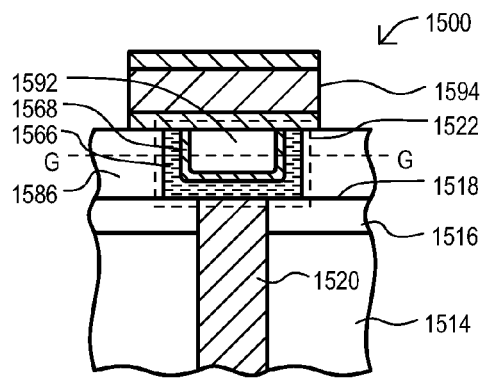
Figure 15G:
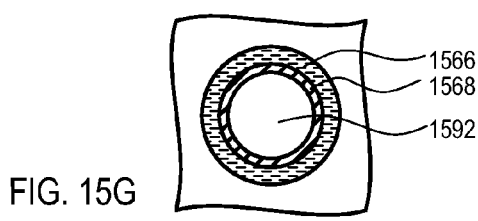

FIGS. 14 to 15G show another method of forming a programmable impedance element that incorporates a first electrode. Such a method may be one example of those show as steps 110, 610, 810, 1010 in FIGS. 1, 6, 8, and 10, respectively.

The particular embodiment of FIGS. 14 to 15F also shows the formation of a PMC as the programmable element. However, unlike FIGS. 13A to 13D, layers of a PMC may be formed on bottom and side surfaces within an opening formed in an insulating layer.

A method 1400 may include forming a cell insulating layer over a first electrode (1472). In some embodiments, such a step may include depositing an insulating layer according to techniques described for an ILD and/or a cap layer in steps 632 and 634 of FIG. 6, as but a few examples. FIG. 15A shows one example of a device 1500 following a step 1472. A cell insulating layer 1586 may be formed on a top surface of a cap layer 1516. However, in alternate embodiments a cell insulating layer 1586 may be formed on a top surface of an ILD 1514 (with the corresponding first electrode having a top surface substantially coplanar with that of the ILD).

An opening may be formed in a cell insulating layer that exposes a first electrode (1474). FIG. 15B shows one example of a device 1500 following a step 1474. A cell opening mask 1588 may be formed on cell insulating layer 1586, and an opening 1590 formed in cell insulating layer 1586. Within cell opening 1590 a top surface of first electrode 1520 may be exposed.

An ion conductor layer may be formed within a cell opening in contact with a first electrode (1476). In addition, an active electrode layer may be formed within a cell opening in contact with the ion conductor layer (1478). FIG. 15C shows one example of a device 1300 following a step 1478. An ion conductor layer 1566 and active electrode layer 1568 may be formed on a top surface of cell insulating layer 1586, as well as on a bottom and side surfaces of cell opening 1590.

A fill insulating layer may be formed within a cell opening over an ion conductor layer (1480). FIG. 15D shows one example of a device 1500 following a step 1480. A fill insulating layer 1592 may be formed within cell opening 1590 as well as on a top surface of cell insulating layer 1586. In very particular embodiments, a fill insulating layer may include silicon dioxide, silicon nitride, or silicon oxynitride.

A surface may then be planarized to a top surface of a cell insulating layer (1482). Such a step may form a cell portion within the cell opening. FIG. 15E shows one example of a device 1500 following a step 1482. A cell portion 1522 may be formed that includes an ion conductor layer 1566 and active electrode layer 1568 formed on bottom and side surfaces of the cell opening 1590. Further, a fill insulating layer 1592 may be formed between vertically extending portions of ion conductor and active electrode layers (1566 and 1568). As shown, an ion conductor layer 1566 can include first portions that are parallel to a bottom surface of a cell opening 1590, and second portions that are parallel to a side surface of a cell opening 1590. Similarly, an active electrode layer 1568 can include first portions that are parallel to a bottom surface of a cell opening 1590, and second portions that are parallel to a side surface of a cell opening 1590.

In the embodiment of FIG. 14, an interconnect structure may then be formed in contact with the ion conductor layer and active electrode layer (1484). FIG. 15F shows one example of device 1500 following a step 1484. An interconnect structure 1594 may be formed in contact with cell portion 1522. An interconnect structure 1594 may be formed from multiple layers, or may be a single layer. In one very particular embodiment, an interconnect structure 1594 may include copper.

FIG. 15G shows a top cross sectional view of a cell portion 1522 taken along line G-G of FIG. 15F. Thus, the cell opening of FIGS. 15A to 15G may be circular. However, alternate embodiments may have different shapes.

FIGS. 16 and 17A to 17G show a further method of forming a programmable impedance element that incorporates a first electrode. Such a method may be one example of those show as steps 110, 610, 810, 1010 in FIGS. 1, 6, 8, and 10, respectively.

Figure 16:
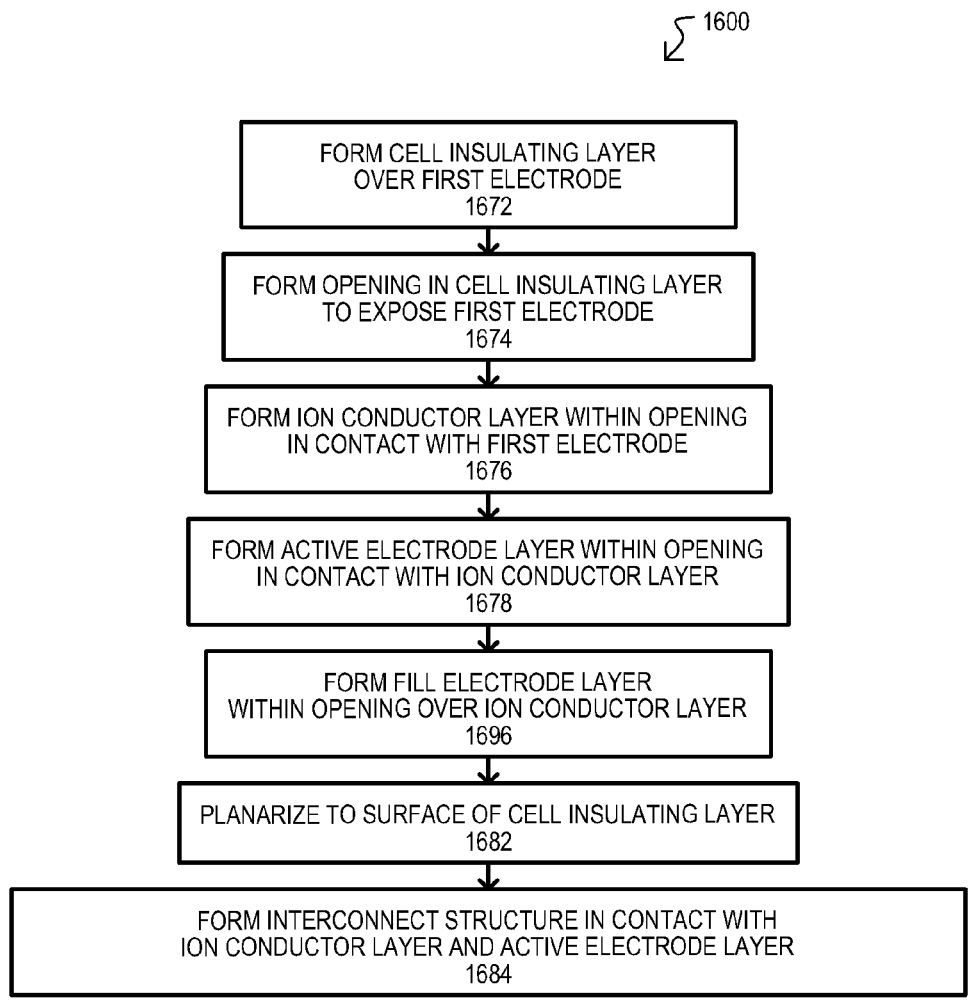
FIG. 16 is a flow diagram showing a method of fabricating a programmable impedance device with elements formed in an opening over a cap layer according to another embodiment.

FIG. 16 can include many steps like those of FIG. 14. Such like steps are referred to by the same reference character but with the first two digits being "16" instead of "14". Similarly, FIGS. 17A to 17G can include many items like those of FIGS. 15A to 15G, and such like items are referred to by the same reference character but with the first two digits being "17" instead of "15".

Figure 17A:
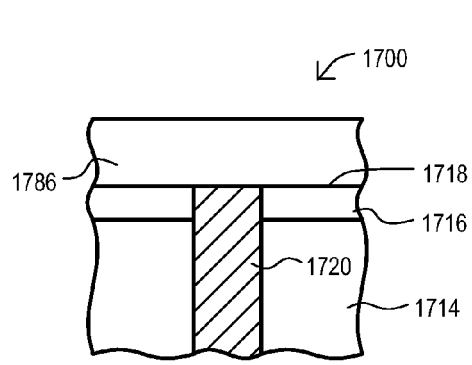
FIGS. 17A to 17G are a series of views showing a method like that of FIG. 16.
Figure 17B:
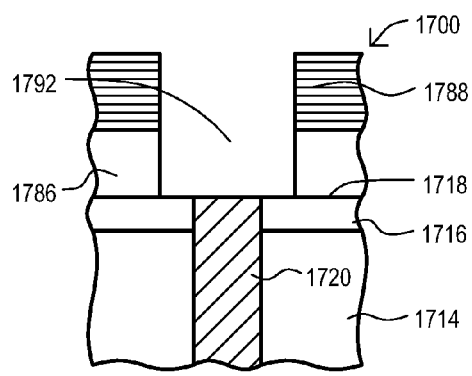
Figure 17C:
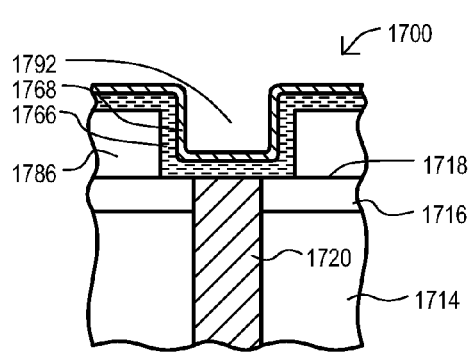
Figure 17D:
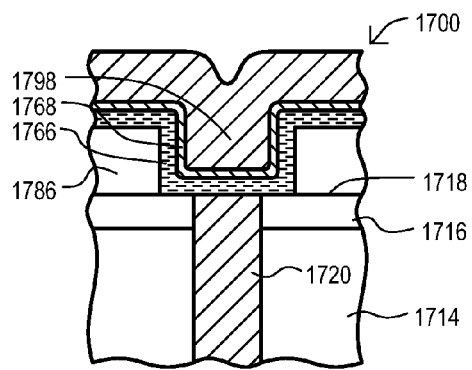
Figure 17E:
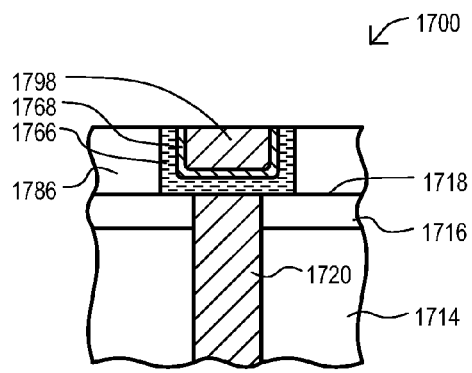
Figure 17F:
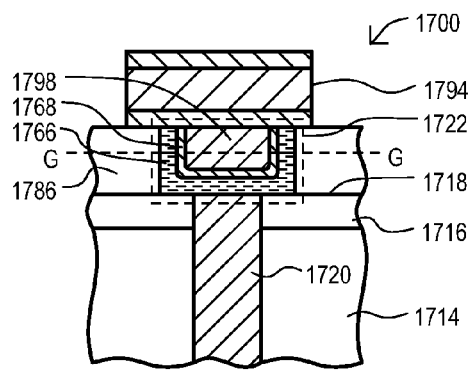
Figure 17G:
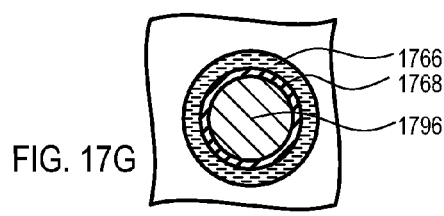

FIG. 16 differs from FIG. 14 in that instead of an insulating fill layer being deposited (shown as 1594 in FIG. 15D), a fill electrode layer may be deposited within a cell opening, as shown by step 1696 of FIG. 16. FIG. 17D shows one example of a device 1700 after a step 1696. A fill electrode layer 1798 may be formed within cell opening 1790 as well as on a top surface of active electrode layer 1768. In very particular embodiments, a fill electrode layer 1798 may include an indifferent electrode material. In one very particular example, a fill electrode layer 1798 may include tantalum (Ta).

According to such an arrangement, a greater conductive contact area (with respect to a top surface of the PMC) may be provided than is the case for the embodiment of FIGS. 15A to 15G.

It is understood that features of the methods of FIGS. 14 and 16 may be combined. That is, following the formation of a fill electrode layer that only partially fills a cell opening, a fill insulating layer may be deposited formed in the remainder of the opening. In this way, a conductivity of a top contact area may be controlled (i.e., greater fill electrode layer thickness for greater conductivity, less layer thickness for lower conductivity.

FIGS. 18 and 19A-19F show another method of forming a programmable impedance element that incorporates a first electrode. Such a method may be one example of those show as steps 110, 610, 810, 1010 in FIGS. 1, 6, 8, and 10, respectively.

The embodiment of FIGS. 18 and 19A to 19F shows the formation of PMCs as programmable elements. Such PMCs may be formed with an integral common anode line in a "damascene" fashion.

Figure 18:
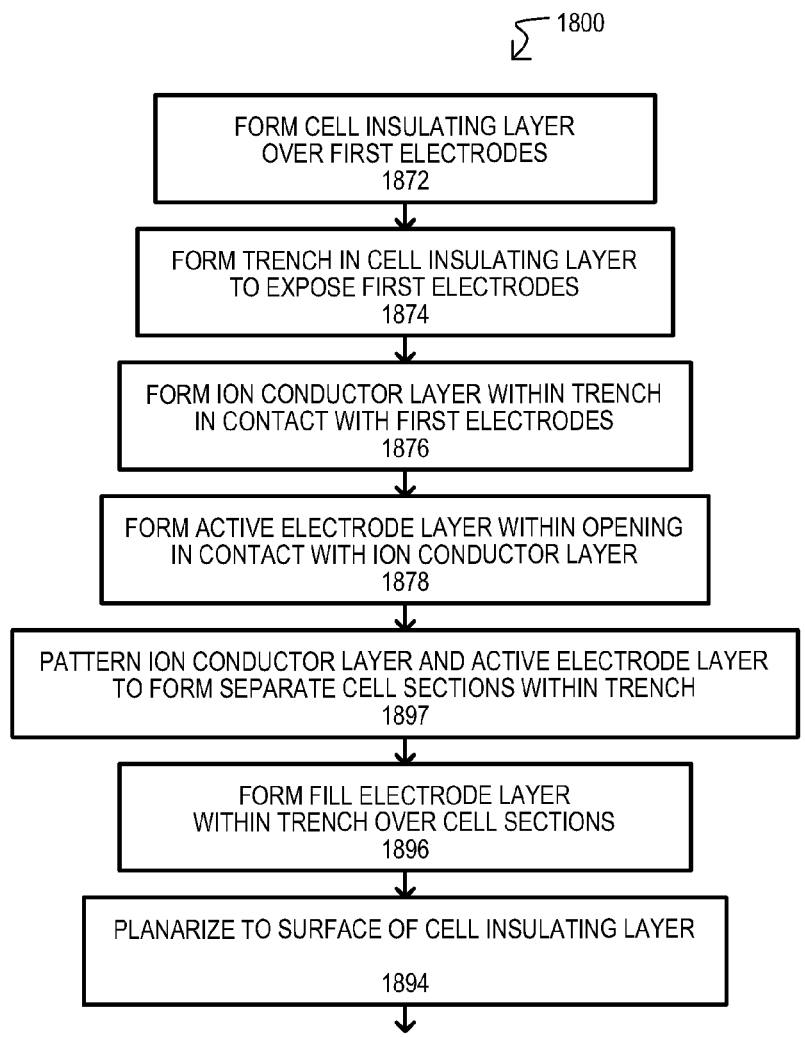
FIG. 18 is a flow diagram showing a method of fabricating a programmable impedance device with elements formed in a trench opening over a cap layer according to another embodiment.

FIG. 18 includes steps like those of FIG. 16. Such like steps are referred to by the same reference character but with the first two digits being "18" instead of "16". Similarly, FIGS. 19A to 19F can include many items like those of FIGS. 17A to 17G. Such like items are referred to by the same reference character but with the first two digits being "19" instead of "17". FIGS. 19A to 19F differ from FIGS. 17A to 17F in that two cross sectional views are shown, one along a trench width, the other along a trench length.

Figure 19A:
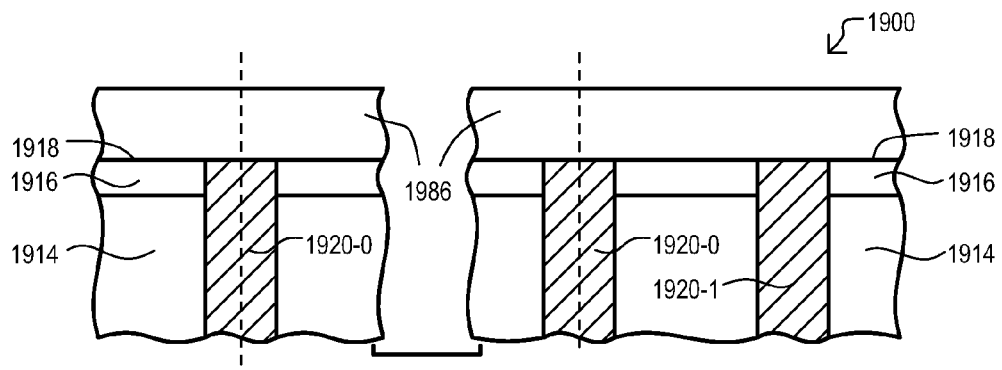
FIGS. 19A to 19F are a series of views showing a method like that of FIG. 18.
Figure 19B:
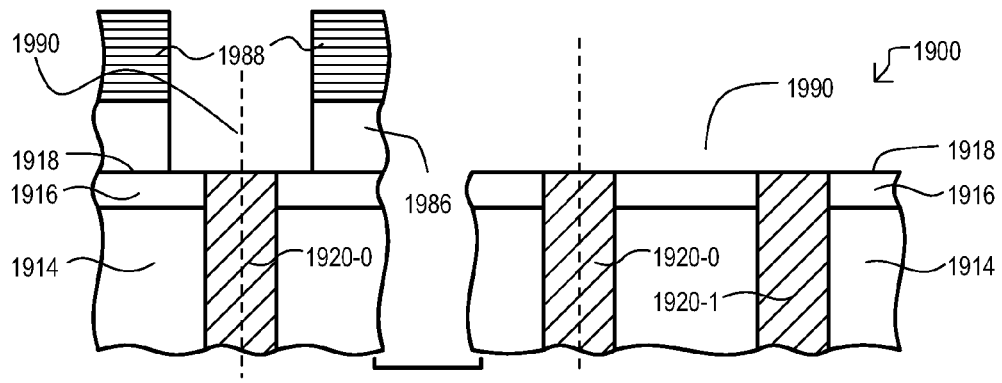

FIG. 18 differs from FIG. 16 in that a trench is formed in a cell insulating layer that exposes multiple first electrodes (1874). FIG. 19B shows one example of a device 1900 following a step 1874. A trench 1990 can be formed that exposes multiple first electrodes (1920-0/1).

Figures 0, 19C:
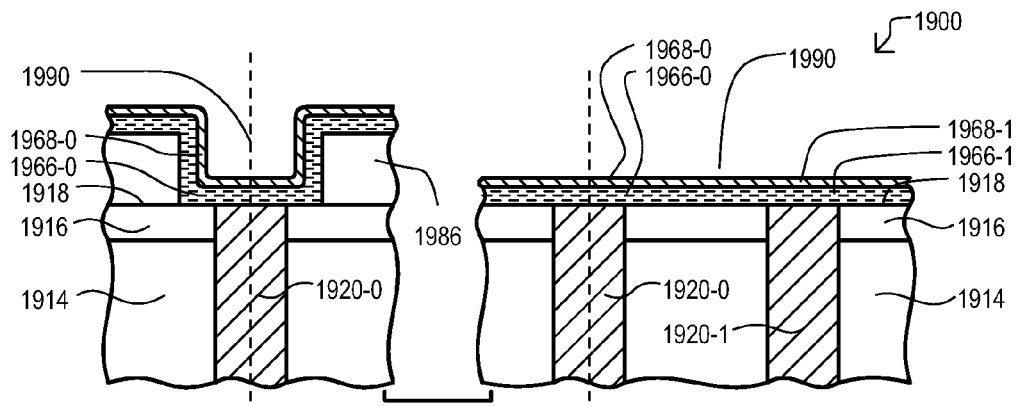
Figures 1, 19C:
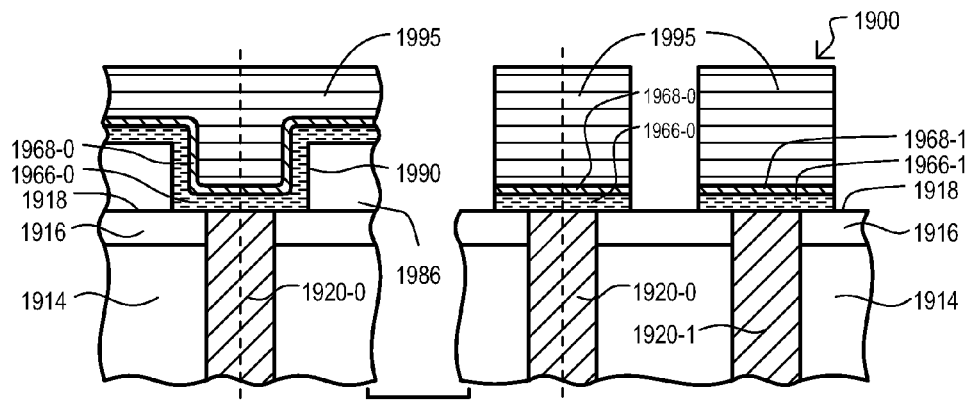
Figure 19D:
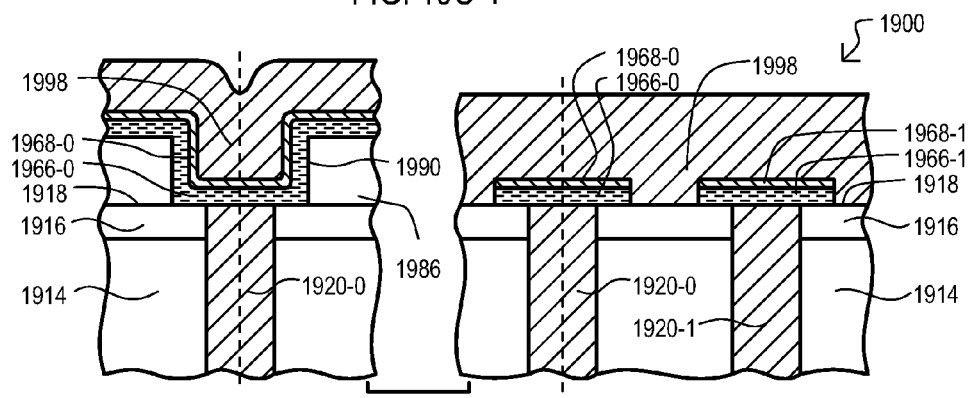

FIG. 18 also differs from FIG. 16 in that, after an ion conductor layer and active electrode layer have been deposited within the trench, such layers may be patterned (1897). FIG. 19C-1 shows one example of a device 1900 after a step 1897. An element etch mask 1995 may be formed that covers selected sections of an ion conductor layer 1966 and active electrode layer 1968 within a trench 1990. Exposed portions of such layers may be etched, including within the trench 1990.

Figure 19E:
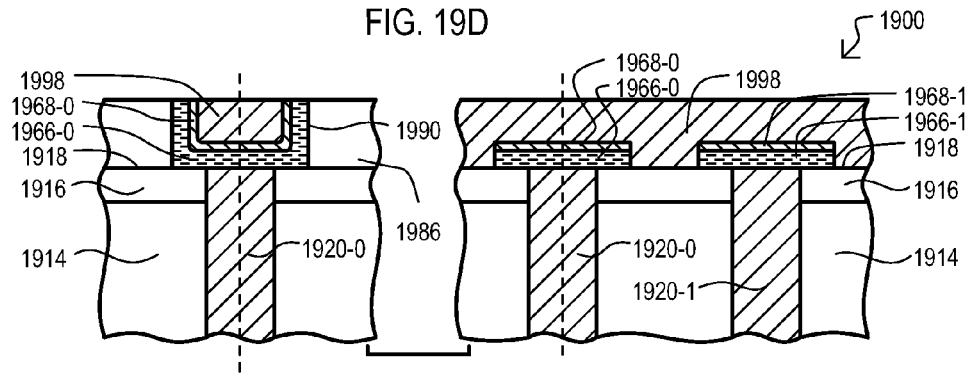
Figure 19F:
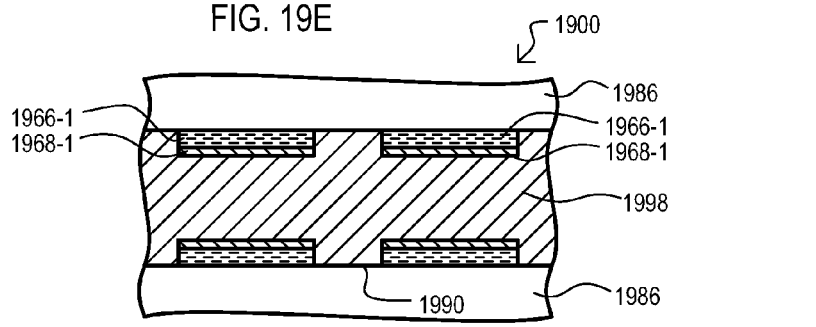

FIG. 19F shows a top view of a resulting damascene PMC structure following a step 1894. As shown, separate PMC elements may be formed by ion conductor sections 1966-0/1 and active electrode layer sections 1968-0/1 wrapped around a bottom and side surfaces of a common anode fill layer 1998.

While embodiments above have shown methods for forming a bottom electrode for programmable impedance elements, other embodiments can include memory materials of such programmable impedance elements, as well as methods of forming such memory materials. An active material within the memory material may determine programmable characteristics of the programmable impedance elements. In particular embodiments, agglomeration of the active material within the memory material may be controlled.

Figure 20:
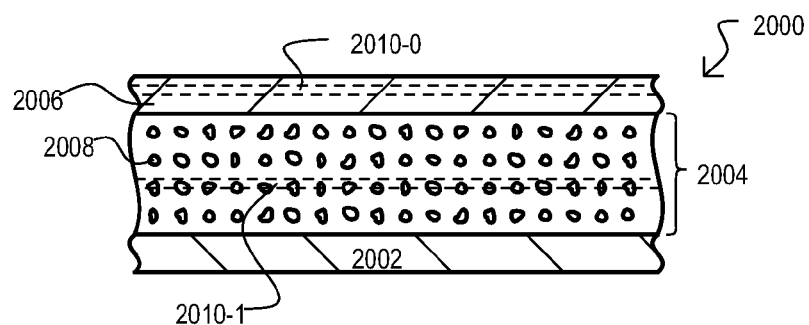
FIG. 20 is a side cross sectional view of a programmable impedance memory element with an agglomeration limiting material according to an embodiment.

FIG. 20 shows one example of a programmable impedance element (hereinafter "programmable element") according to an embodiment. A programmable element 2000 may include a first electrode 2002, a memory material 2004, and a second electrode 2006. A memory material 2004 may have an active material formed therein. An active material may form agglomerations (one shown as 2008) within memory material 2004. Memory material 2004 with agglomerations may be writable between two or more impedance states. Further, a size or distributions of agglomerations may alter the writing properties of the memory material 2004.

An inhibitor material (2010-0 and/or 2010-1) may be included within one of the electrodes (2002 or 2006) or the memory material 2004, or both. An inhibitor material 2010-0/1 may control the tendency of the active material to agglomerate or incorporate into larger clusters. In a particular embodiment, an inhibitor material 2010-0/1 may alter the free energy of a system formed by the programmable element 2000. Consequently, a programmable element 2000 may have a more controlled agglomeration of the active material than a programmable element formed without such an inhibitor material 2010-0/1.

In one very particular embodiment, a programmable element 2000 may be a programmable metallization cell (PMC) and a memory material 2004 may be an ion conductor, and an active material may be an active metal. An active metal may be a metal that can provide ions for conduction within an ion conductor. Further, one of the electrodes (2002 or 2006) may be an active electrode (i.e., may include the active metal), while the other of the electrodes (2006 or 2002) may be an "indifferent" electrode (i.e., does not substantially provide any conductive ions to the memory material 2004).

Figure 21:
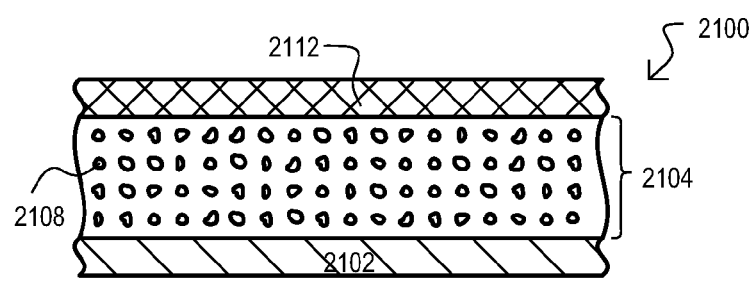
FIG. 21 is a side cross sectional view of a programmable impedance memory element with an agglomeration limiting electrode according to an embodiment.

FIG. 21 shows a programmable element 2100 according to another embodiment. A programmable element 2100 may be a PMC that includes an ion conductor 2104 having active metal agglomerations (one shown as 2108) formed therein, and an indifferent electrode 2102.

A programmable element 2100 may also include an active metal alloy 2102. An active metal alloy 2102 may be an alloy that includes the active metal incorporated within ion conductor 2104, as well as one or more other metals that are not a substantial source of conductive ions for ion conductor 2104.

In particular embodiments, an active metal may be silver (Ag) and/or copper (Cu), and an alloy of such metals may include a refractory metal. A refractory metal can include titanium (Ti), vanadium (V), chromium (Cr), zirconium (Zr), niobium (Nb), molybdenum (Mo), ruthenium (Ru), rhodium (Rh), halfnium (Hf), tantalum (Ta), tungsten (W), rhenium (Re), osmium (Os), or iridium (Ir). In very particular embodiments, an alloy may be a silver/tantalum alloy (Ag/Ta). Other embodiments can include tertiary alloys of an active metal. In one particular embodiment, a tertiary alloy can be tertiary silver-tin-indium alloy (AgSnIn).

Figure 22:
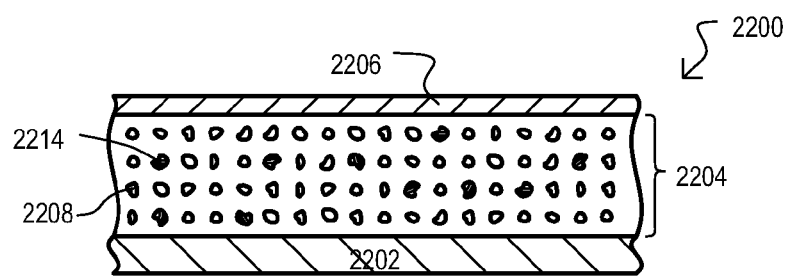
FIG. 22 is a side cross sectional view of a programmable impedance memory element with an agglomeration limiting alloy in a memory layer according to an embodiment.

FIG. 22 shows a programmable element 2200 according to another embodiment. A programmable element 2200 may be another PMC that includes an active electrode 2206, an ion conductor 2204, and an indifferent electrode 2202. An ion conductor 2204 may include active metal agglomerations (one shown as 2208), as well as alloy agglomerations (one shown as 2214). Alloy agglomerations (e.g., 2214) may be formed from an alloy that includes the active metal, as well as one or more other metals that are not a substantial source of conductive ions for ion conductor 2204.

As in the case of FIG. 21, an active metal may be Ag and/or Cu, and an alloy of such metals may include a refractory metal. In very particular embodiments, an alloy may be silver/tantalum alloy (Ag/Ta). Other embodiments can include tertiary alloys of an active metal, and in particular embodiments, can include AgSnIn.

Figure 23:
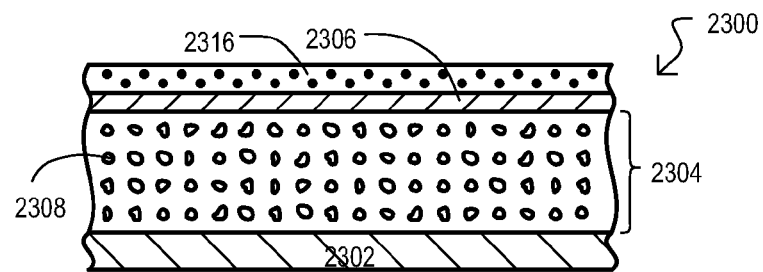
FIG. 23 is a side cross sectional view of a programmable impedance memory element with two ion conducting layers according to an embodiment.
Figure 24:
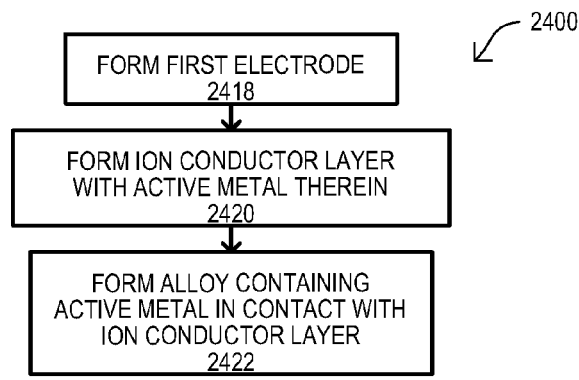
FIGS. 24 and 25A to 25D are a series of diagrams showing a method of forming a programmable impedance memory element like that of FIG. 21.

FIG. 23 shows a programmable element 2300 according to another embodiment. A programmable element 2300 may be another PMC that includes an active electrode 2306, a base ion conductor 2304, and an indifferent electrode 2302. A base ion conductor 2304 may include active metal agglomerations (one shown as 2308).

In addition, programmable element 2300 may include a second ion conductor layer 2316 in contact with active electrode 2306. A second ion conductor layer 2316 may be an ion conductor for a same active material as base ion conductor 2304. In one particular embodiment, a second ion conductor layer 2316 may have a greater ionic conductivity than base ion conductor 2304.

In one particular embodiment, an active metal may be silver (Ag), a base ion conductor may include germanium disulfide ($GeS_2$), and a second ion conductor may include silver sulfide ($Ag_2S$). In another particular embodiment, an active metal may be copper, and a second ion conductor may be copper disulfide ($CuS_2$).

FIGS. 24 and 25A to 25D show a method 2400 of forming a programmable element. In one particular example, a method 2400 may form a programmable element 2100 like that of FIG. 21.

Figure 25A:
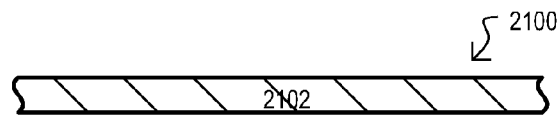

A method 2400 may include forming a first electrode (2418). Such an action may include depositing an indifferent electrode material. As but one example, such a method may include depositing titanium, tungsten, tantalum, or a combination thereof. FIG. 25A shows one example of a programmable element 2100 following a step 2418. An indifferent electrode 2102 may be formed.

Figure 25B:
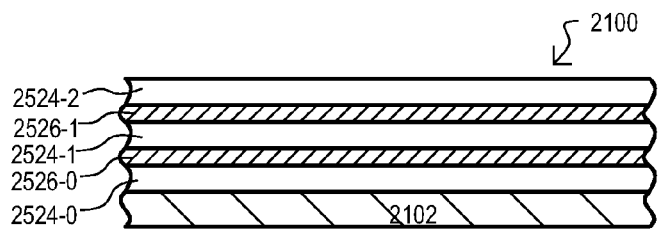
Figure 25C:
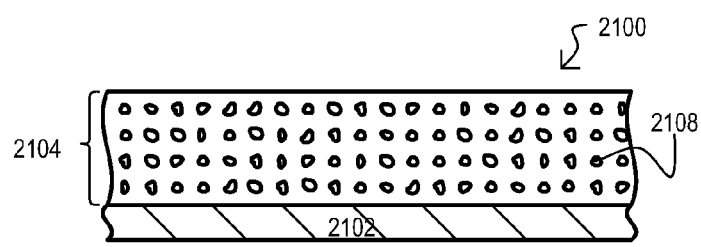

A method may then include forming an ion conductor layer with an active metal formed therein (2420). FIGS. 25B and 25C show one example of a step 2420 for a programmable element 2100. FIG. 25B shows ion conductor layers 2524-0, 1,2 which may be alternated with active metal layers 2526-0,1. While FIG. 25B shows three ion conductor layers and two active metal layers, other embodiments may include fewer or greater numbers of such layers. For example, some embodiments can include one layer of an ion conductor and one layer of an active metal. It is noted that an active metal layer (2526-0,1) need not be contiguous. That is, an active metal layer may be a scattering of the active metal on a surface of an ion conductor layer.

Ion conductor layers may be formed by deposition methods, including but not limited to chemical vapor deposition (CVD) technology, atomic layer deposition (ALD) technology, physical vapor deposition (PVD) technology, or any other suitable technology. A technology that provides the best thickness control of the layer is preferable. Active metal layers may be formed by sputtering.

FIG. 25C shows a programmable element 2100 following an active metal incorporation step. An ion conductor/active metal combination may be subject to a heat and/or light treatment step that results in active metal agglomerations (one shown as 2108) being distributed within ion conductor layer 2104.

In some embodiments, an ion conductor layer may include a chalcogenide and/or transition metal oxide. In particular embodiments, an ion conductor layer can include $GeS_2$. In particular embodiments, an active metal can include Ag and/or Cu.

Figure 25D:
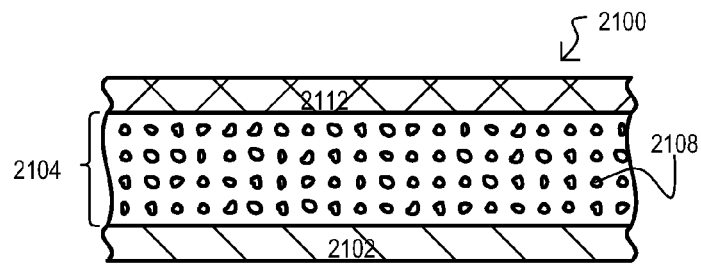
Figure 26:
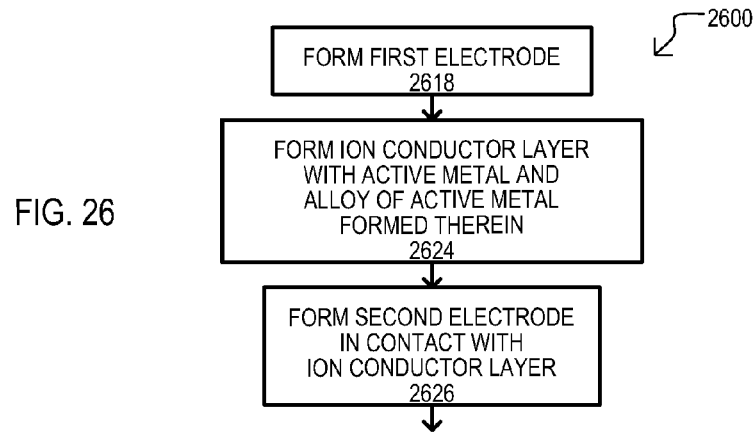
FIGS. 26 and 27A to 27E are a series of diagrams showing a method of forming a programmable impedance memory element like that of FIG. 22.

A method 2400 may further include forming an alloy containing the active metal in contact with the ion conductor layer (2422). FIG. 25D shows one example of a programmable element 2100 following a step 522. An alloy 2112 may be formed on ion conductor 2108. A resulting structure may be subject to the variants in materials noted in conjunction with FIG. 21, and equivalents.

FIGS. 26 and 27A to 27E show a method 2600 of forming a programmable element according to another embodiment. In one particular example, a method 2600 may form a programmable element 2200 like that of FIG. 22.

A method 2600 may include forming a first electrode (2618). Such an action may actions like those described for 2418, in FIG. 24, or equivalents.

Figure 27A:
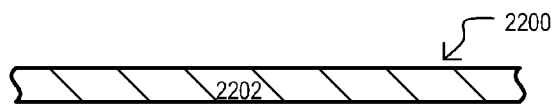

FIG. 27A shows one example of a programmable element 2200 following a step 2618. An indifferent electrode 2202 may be formed.

A method 2600 may then include forming an ion conductor layer with an active metal and an alloy of the active metal formed therein (2624). It is understood that such a step includes forming agglomerations of both material (active metal and alloy) in sufficiently small amounts to maintain the programmability of the structure (i.e., prevent such agglomerations from forming a short circuit through the ion conductor layer 2214).

Figure 27B:
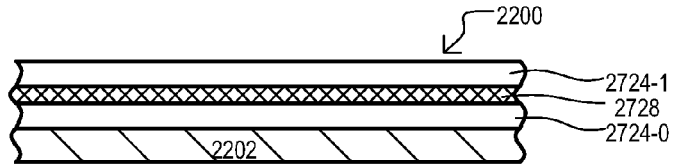
Figure 27C:
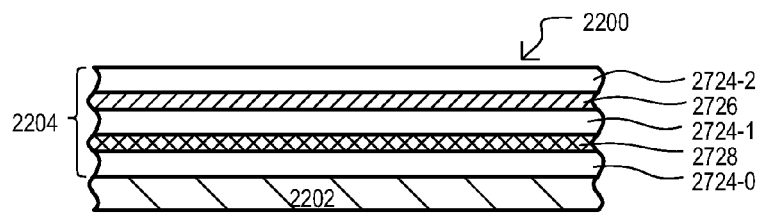

FIGS. 27B to 27C show one example of a step 2624 for a programmable element 2200. FIG. 27B shows ion conductor layers 2724-0,1 alternated with an alloy layer 2728. An alloy layer 2728 may be formed from an alloy of an active material. In particular embodiments, such an alloy may include those examples noted for layer 2112 of FIG. 21. While FIG. 27B shows two ion conductor layers and one alloy layer, other embodiments may include greater numbers of such layers.

FIG. 27C shows an active metal layer 2726 alternated with ion conductor layers 2724-1,2. While FIG. 27C shows two ion conductor layers and one active metal layer, other embodiments may include greater numbers of such layers.

Ion conductor layers 2724-0,1,2 may be deposited according to the methods noted in the description of FIG. 26B, or equivalents. An alloy layer 2728 and active metal layer 2726 may be deposited with sputtering or any other suitable techniques.

Figure 27D:
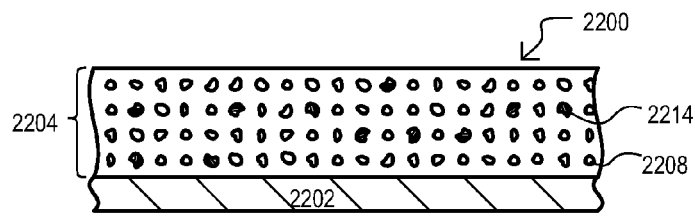

FIG. 27D shows a programmable element 2200 following an incorporation step. An ion conductor/active metal/alloy combination may be subject to a heat and/or light treatment step that results in active metal agglomerations (one shown as 2208) and alloy agglomerations (one shown as 2214) distributed therein.

Figure 27E:
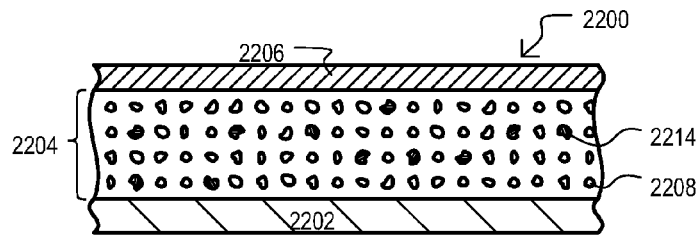
Figure 28:
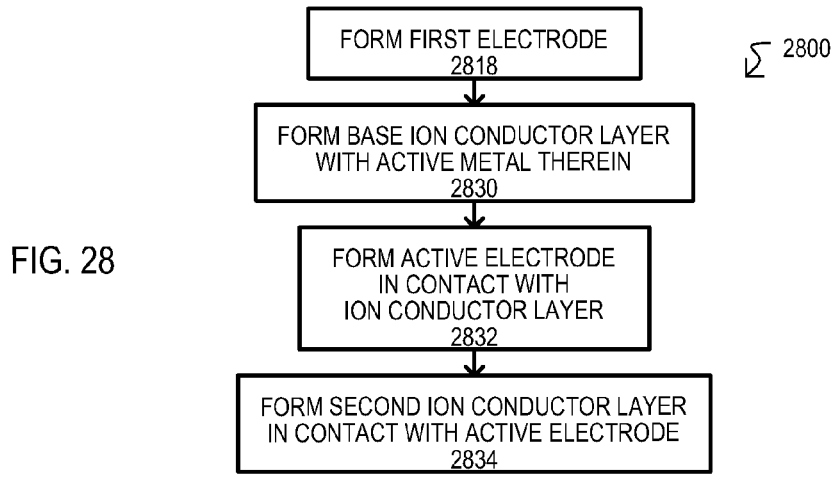
FIGS. 28 and 29A to 29E are a series of diagrams showing a method of forming a programmable impedance memory element like that of FIG. 23.

A method 2600 may further include forming a second electrode in contact with the ion conductor layer (2626). FIG. 27E shows one example of a programmable element 2200 following a step 2626. A second electrode 2206 may include an active metal. For example, a second electrode 2206 may be formed entirely of an active metal dissolved within an ion conductor layer 2704. Alternatively, a second electrode 2206 may include an active metal alloy as described for the embodiments herein.

FIGS. 28 and 29A to 29E show another method 2800 of forming a programmable element according to an embodiment. In one particular example, a method 2800 may form a programmable element 2300 like that of FIG. 23.

Figure 29A:
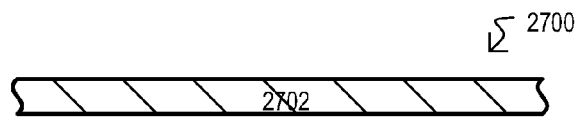

A method 2800 may include forming a first electrode (2818). Such an action may actions like those described for 2418, in FIG. 24, or equivalents. FIG. 29A shows one example of a programmable element 2300 following a step 2818. An indifferent electrode 2702 may be formed.

Figure 29B:
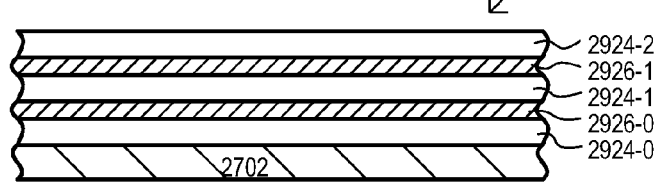
Figure 29C:
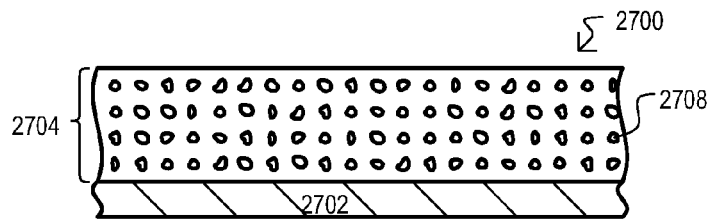

A method may then include forming a base ion conductor layer with an active metal formed therein (2830). FIGS. 29B and 29C show one example of a step 2830 for a programmable element 2300. FIG. 29B shows ion conductor layers 2924-0,1,2 alternated with active metal layers 2926-0,1. While FIG. 29B shows three ion conductor layers and two active metal layers, other embodiments may include lesser or greater numbers of such layers.

FIG. 29C shows a programmable element 2700 following an incorporation step. An ion conductor/active metal combination may be subject to a heat and/or light treatment step that results in active metal agglomerations (one shown as 2308) distributed therein.

Figure 29D:
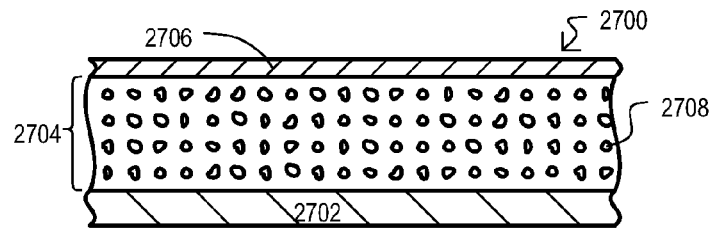

A method 2800 may further include forming a second electrode in contact with the ion conductor layer (2832). FIG. 29D shows one example of a programmable element 2700 following a step 2832. A second electrode 2706 may include an active metal. For example, a second electrode 2706 may be formed entirely of the active metal. Alternatively, a second electrode 2706 may include an alloy, like active metal alloy 2112 of FIG. 21.

Figure 29E:
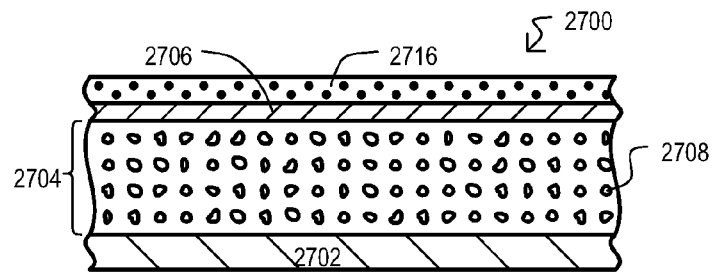

A method 2800 may also include forming a second ion conductor layer in contact with the second electrode (2834). FIG. 29E shows programmable element 2300 after a step 2834. A second ion conductor layer 2716 may be formed on a stop surface of second electrode 2706. A second ion conductor 2716 may be formed from materials as noted in conjunction with FIG. 23.

FIGS. 30A to 30E show a programmable element 3000 according to an alternate embodiment and method of making such a structure.

FIG. 30A shows the formation of a cell opening 3042 in a cell insulating layer 3038. A cell opening 3042 may expose a first electrode 3002 formed within a dielectric layer 3036.

FIG. 30B shows the formation of layers like those of FIG. 25B, within an opening 3042 and on a top surface of a cell insulating layer 3038. In particular, FIG. 30B shows ion conductor layers 3024-0,1 alternated with an active metal layer 3026. While FIG. 30B shows two ion conductor layers and one active metal layer, other embodiments may include greater numbers of such layers.

FIG. 30C shows a programmable element 3000 following an active metal incorporation step. An ion conductor/active metal combination may be subject to a heat and/or light treatment step that results in active metal agglomerations (one shown as 3008) distributed therein.

FIG. 30D shows the formation of additional layers of programmable element 3000. In the example shown, an alloy layer 3012 and fill layer 3040 may be formed within an opening 3042 and on a top surface of a cell insulating layer 3038. An alloy layer 3012 may be formed from the same material as that shown as 2112 in FIG. 21. A fill layer 3040 may be an insulating layer or a conductive layer.

FIG. 30E shows a planarization step that planarizes programmable element 3000 to a top surface of cell insulating layer 3038.

Figure 31:
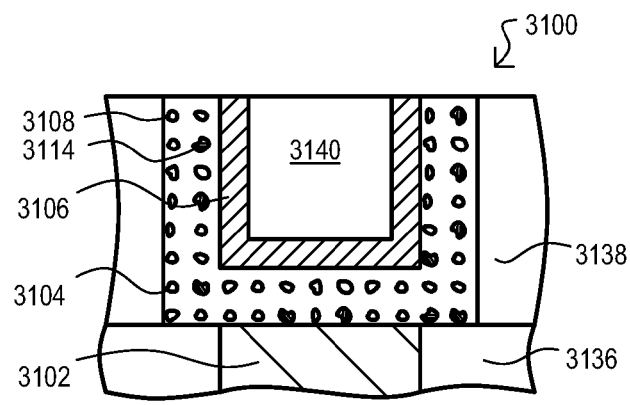

FIG. 31 shows a programmable element 3100 according to a further embodiment. Programmable element 3100 may include a first electrode 3102 formed within a dielectric layer 3136. A first electrode 3102 may take the form of any indifferent electrodes described herein, or equivalent. An ion conductor layer 3104, second electrode layer 3106, and fill layer 3140 may be formed on first electrode 3102 within an opening formed within a cell insulating layer 3138. An ion conductor layer 3104 may take the form of any of those shown herein, or equivalents.

A second electrode layer 3106 may be formed from an active metal or an active metal alloy, as but two examples. An ion conductor layer 3104 may include active metal agglomerations (one shown as 3108) as well as active metal alloy agglomerations (one shown as 3114), in same or equivalent fashion as ion conductor layer 2204 of FIG. 22. A fill layer 3140 may be an insulating layer or a conductive layer.

A programmable element 3100 may be formed with a planarization step like that described in conjunction with FIG. 31E.

Figure 32:
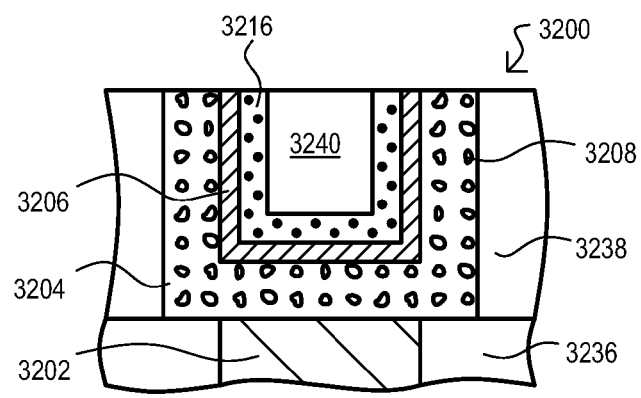
FIG. 32 is a side cross sectional view of a programmable impedance memory element according to a further embodiment.

FIG. 32 shows a programmable element 3200 according to another embodiment. Programmable element 3200 may include a first electrode 3202 formed within a dielectric layer 3236. A base ion conductor layer 3204, second electrode layer 3206, second ion conductor layer 3216, and fill layer 3240 may be formed on first electrode 3202 within an opening formed within a cell insulating layer 3238. A first electrode layer 3202 may take the form of any indifferent electrodes described herein, or equivalent. A base ion conductor layer 3204 may take the form of any of those shown herein, or equivalents.

A second electrode layer 3206 may be formed from an active metal, or an active metal alloy, as but two examples. A base ion conductor layer 3204 may include active metal agglomerations (one shown as 3208) formed therein. A fill layer 3240 may be an insulating layer or a conductive layer. A second ion conductor layer 3216 may be an ion conductor for the same type of ions as base ion conductor layer 3204, but possess a different ion conductor matrix than base ion conductor layer 3204. In a particular embodiment, a second ion conductor layer 3204 may have a greater ion conductivity than a base ion conductor layer 3216. A second ion conductor layer 3216 may be formed from the materials like those of layer 2316 of FIG. 23, or equivalents.

As in the case of FIG. 31, a programmable element 3200 may be formed with a planarization step like that described in conjunction with FIG. 19E.

While the embodiments have shown arrangements in which layers have a particular order, alternate embodiments may have such layers formed in the reverse order.

While the embodiments have shown arrangements in which an active metal and an active metal alloy are deposited separately from an ion conductor layer, in alternate embodiments such materials may be deposited in situ with the ion conductor layer.

While embodiments of the invention can include methods for forming a bottom electrode for programmable impedance elements, and memory materials for such elements, other embodiments can include methods for forming insulating layers over such elements.

Embodiments described herein show methods for forming a programmable impedance element having limited oxidation process steps and/or reduced thermal budget following the formation of programmable impedance elements. Such fewer oxidation steps or reduced thermal budget may reduce defects in the programmable elements.

Figure 33:
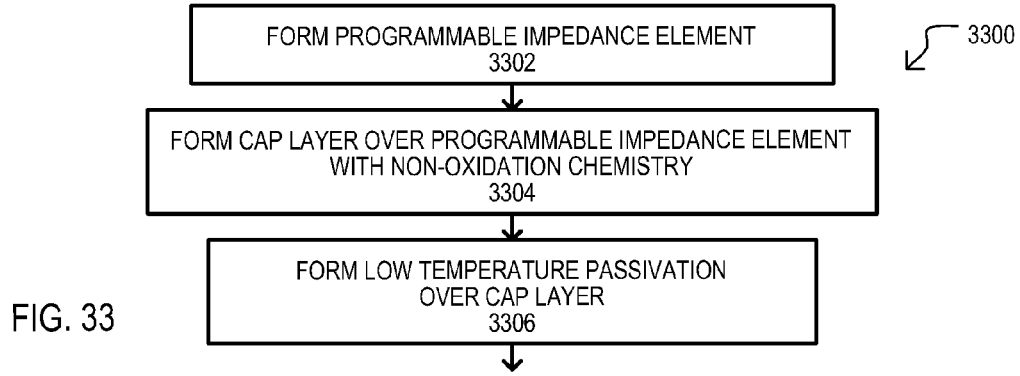
FIG. 33 is a flow diagram of a method according to an embodiment.

FIG. 33 shows one example of a method 3300 of forming a programmable impedance element (hereinafter "programmable element") according to one embodiment. A method 3300 may include forming one or more programmable elements (3302). A programmable element may be formed from multiple layers, and may be programmable between at least two different impedance states.

A cap layer may be formed over a programmable element with non-oxidation chemical reaction (3304). Such a step may form an insulating layer over a programmable element with a chemical reaction based on a reducing chemistry, as opposed to an oxidizing chemistry. Such an operation may prevent layers of a programmable element from being exposed to an oxidation atmosphere, which may create defects. In one very particular example, a programmable element may include silver, and a cap layer may be formed of silicon nitride with a reducing chemical reaction that includes silane ($SiH_4$) and ammonia ($NH_3$).

A method 3300 may further include forming a low temperature passivation over a cap layer (3306). Such a step may provide a protective layer over a cap layer. A low temperature may be less than 300° C. Such a low temperature formation step may decrease a thermal budget of process, which may reduce mechanical stress of a resulting device, and hence reduce stress related defects. Further, in particular embodiments, a programmable impedance element may include a memory layer having agglomerations of an active material formed therein. A reduced temperature cycle may help control a size or rate of such agglomerations.

Figure 34:
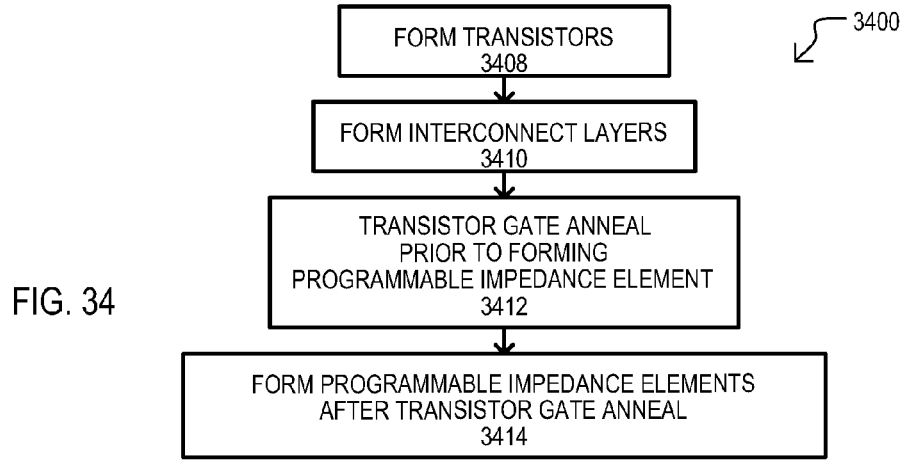
FIG. 34 is a flow diagram of a method according to another embodiment.

FIG. 34 shows another example of a method 3400 according to an embodiment. A method 3400 may include forming transistors (3408). Such an action may include forming insulated gate field effect transistors in a semiconductor substrate.

Optionally, a method 3400 may include forming one or more interconnect layers (3410). Interconnect layers may include conductive contacts to substrate regions, including transistors, as well as one or more conductive interconnect patterns. Multiple interconnect patterns may be conductively connected to one another by conductive vias. In very particular embodiments, such interconnect layers may provide an electrical path between transistors, and subsequently formed programmable elements.

A method 3400 may then perform a transistor gate anneal prior to forming programmable impedance elements (3412). A transistor gate anneal may be a heating step in a predetermined environment for mitigating or repairing gate insulator damage to transistors. In particular embodiments, such a step may include a temperature greater than 350° C. for a duration longer than 1 hour. In a very particular embodiment, such a step may occur in a gas atmosphere that includes ammonia, hydrogen, or both.

A method 3400 may then form one or more programmable elements after a transistor gate anneal state (3414). A programmable element may be formed from multiple layers, and may be programmable between at least two different impedance states.

By forming programmable elements after a gate anneal, such programmable elements may be exposed to fewer thermal cycles than approaches that perform a gate anneal after a top layer passivation has been formed.

Figure 35:
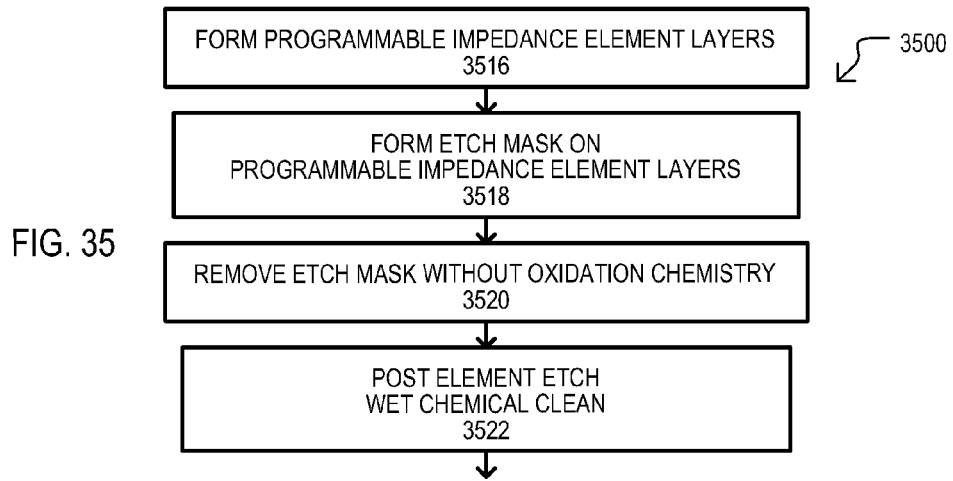
FIG. 35 is a flow diagram of a method according to a further embodiment.

FIG. 35 shows another example of a method 3500 according to an embodiment.

A method 3500 may include forming programmable element layers (3516). Such an action may include forming multiple layers of a programmable element. In one embodiment, such an action may include forming a memory material between two electrodes. In a very particular embodiment, such an action may involve forming layers for programmable metallization cells (PMCs) that includes an ion conductor layer formed between an indifferent electrode layer and an active electrode layer. An indifferent electrode layer may include a metal layer that does not substantially include ions that conduct through the ion conductor layer. An active electrode layer may include a metal layer that includes ions that conduct through the ion conductor layer.

A method 3500 may also include forming an etch mask on programmable element layers (3518). Such an action may include forming an etch mask from a photoresist, or the like. However, alternate embodiments may include masks formed from other materials, such as "hard masks" formed from insulators, such as silicon nitride, or a metallization pattern.

A method 3500 may further include removing the etch mask without an oxidation chemistry (3520). In the event an etch mask is formed from resist, such a step may include a wet chemical resist strip with a suitable solvent. In addition or alternatively, such an action may include a reductive chemical reaction, such as etching with gases including but not limited $H_2$ and/or $N_2$. A step 3520 is in contrast to resist removal techniques such as those that may etch with oxygen (e.g., ashing).

A method 3500 may also include a post element etch wet chemical clean (3522). Such an action may include cleaning with a weak base solution. As but one example, such a cleaning may include trimethyl ammonium hydroxide (THAN). In addition or alternatively, such a method may include cleaning with a suitable ammine.

FIGS. 36A to 36H show a method 3600 of making a PMC integrated circuit device 3632 according to one embodiment.

Figure 36A:
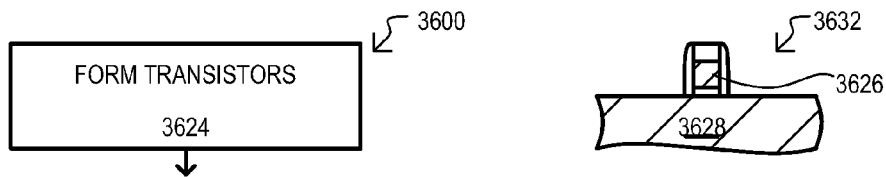

FIG. 36A shows forming transistors (3624). In one particular embodiment, such an action may include forming insulated gate field effect transistors (one shown as 3626) on a substrate 3628. In one particular embodiment, a transistor 3626 may include a conductive gate, insulating side walls, and an insulating top layer.

Figure 36B:
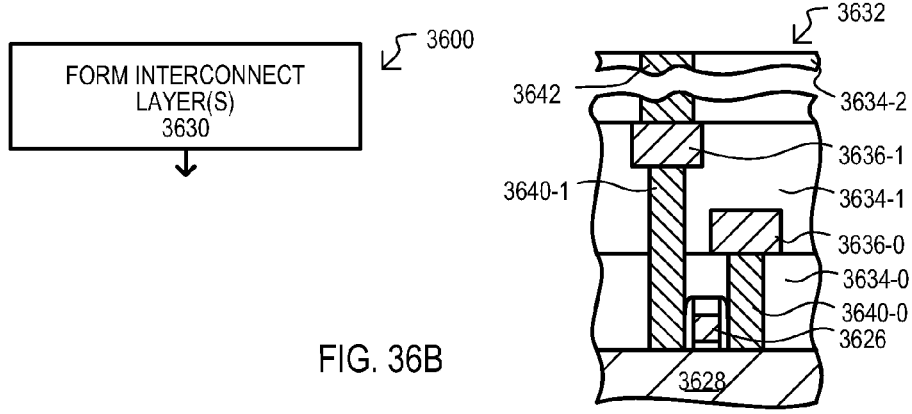

FIG. 36B shows forming one or more interconnect layers (3630). In one particular embodiment, such an action may include forming one or more conductive patterns separated from one another by interlayer dielectrics (ILDs). Further, conductive interconnections (e.g., contacts or vias) may extend in a vertical direction between such interconnect layers. The particular embodiment of FIG. 36B shows an integrated circuit 3632 that includes a first ILD 3634-0, a first interconnect pattern 3636-0, a second ILD 3634-1, a second interconnect patter 3636-1, and a third ILD 3634-2. Also shown are contacts 3640-0/1 and a via 3642. Etching and other processes utilized in forming interconnect layers may lead to damage in a gate insulator of transistor 3626.

Figure 36C:
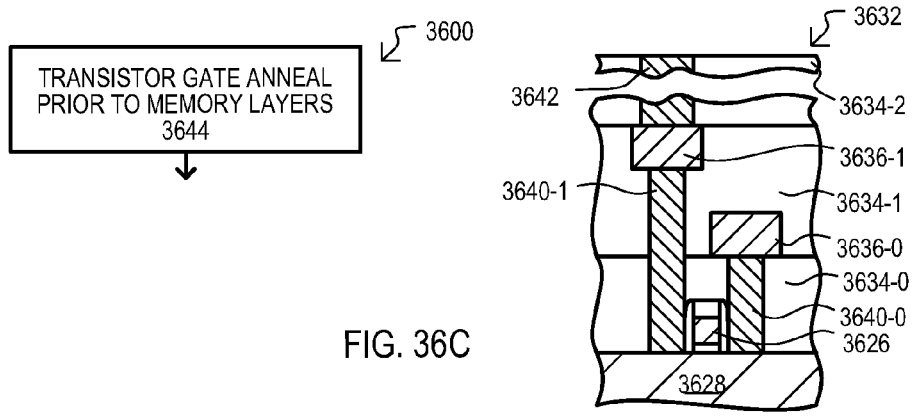

FIG. 36C shows a transistor gate anneal prior to forming memory layers (3644). Such an action may include a heat treatment step to eliminate or mitigate damage to an insulator of transistor 3626 may have arisen from previous process steps. Such an action may include a temperature greater than 350° C. for a duration longer than 1 hour. Such a step may occur in a gas atmosphere that includes ammonia, hydrogen, or both. It is understood that the transistor gate anneal occurs prior to layers of a programmable element. However, as noted below, a via 3642 may form an electrode of a programmable element. In such an embodiment, such an electrode (via 3642), may be subject to the transistor gate anneal, while remaining layers of a programmable element are not.

Figure 36D:
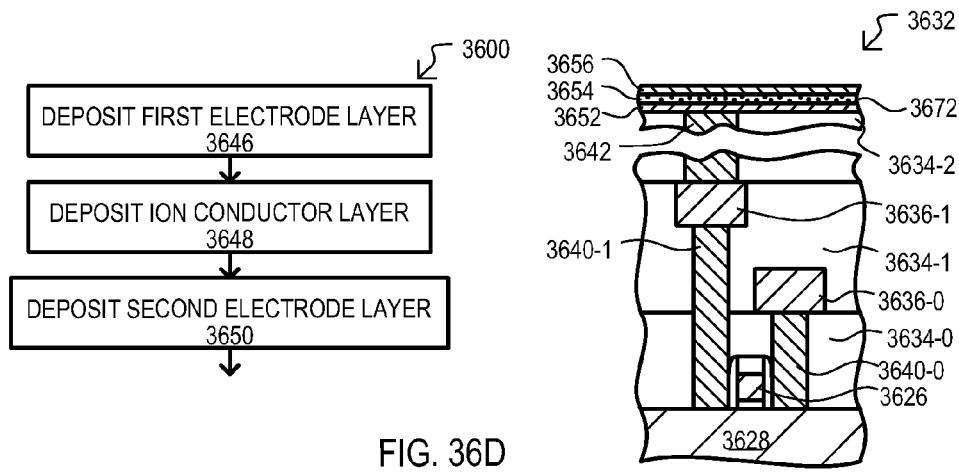

FIG. 36D shows the formation of PMC element layers, including optionally depositing a first electrode layer (3646), depositing an ion conductor layer (3648), and depositing a second electrode layer (3650). As noted above, a via 3642 may serve as an electrode of a programmable element. In such a case, forming first electrode (3646) may be omitted.

In the particular embodiment shown, a first electrode layer 3652, ion conductor layer 3654, and second electrode layer 3656 may be formed on third ILD 3634-2. A first electrode layer 3652 may be an indifferent electrode formed form materials described for embodiments shown herein, or equivalents. An ion conductor layer 3654 may be formed from suitable materials described, and in one very particular embodiment, can include $GeS_2$, with Ag distributed therein. A second electrode layer 3656 may be an active electrode formed according to the embodiments described herein, or equivalents.

FIG. 36E shows the formation of an etch mask (3658) and the patterning of memory layers (3660). In the embodiment shown, an etch mask 3662 may be formed over memory layers. Etching may take place that removes portion of memory layers exposed by etch mask 3662. In one particular embodiment, an etch mask 3662 may be formed from photoresist, or the like. FIG. 36E shows an integrated circuit 3632 following an etch step. A PMC structure 3661 may be formed below an etch mask 3662.

FIG. 36F shows resist strip and post strip cleaning. In the particular method shown, such actions may include a non-oxidizing strip with a plasma that includes $N_2$ and/or $H_2$ (3664). In addition or alternatively, a resist etch pattern may be removed with a wet chemical resist strip (3666). In addition, a wet chemical cleaning may then occur (3668) to remove any etch residue. Such a wet chemical cleaning (3668) may utilize a weak base solution, TMAH (as noted above), and/or a suitable ammine. FIG. 36F shows an integrated circuit 3632 following such a step. As etch mask 3662 is removed. However, such an operation may not subject a PMC structure 3661 to an oxidizing atmosphere, which may otherwise contribute to defects.

FIG. 36G shows the formation of a cap layer, in particular, a silicon nitride cap layer formed with a reducing chemistry (as opposed to an oxidizing chemistry) (3670). In one example, such an arrangement may include a reducing reaction with silane and ammonia. FIG. 36G shows an integrated circuit 3632 following such a step. A cap layer 3672 may be formed that covers PMC structure 3661. Such an operation may provide a protective cap layer 3672 over PMC structure 3661, while not exposing such a structure to an oxidizing atmosphere.

FIG. 36H shows the formation of a low temperature passivation layer. In particular, a method 3600 may include forming an oxide with a low temperature decomposition of TEOS (3674). In addition or alternatively, a method 3600 may include forming a low temperature cure polyimide (3676). Both such steps may provide a low thermal budget process. By doing so, mechanical stress in a PMC structure 3661 may be reduced, which may help prevent stress related defects.

FIGS. 37A to 37D show a method 3700 of making a PMC integrated circuit device according to another embodiment. Such a method may include actions like those shown in FIGS. 36A and 36B. Accordingly, like features are shown by the same reference character but with the first digits being "37" instead of "36".

FIG. 37A shows forming a cell insulating layer with an opening (3780), followed by a transistor gate anneal like that of FIG. 36C. A cell insulating layer 3784 may be formed on a third ILD 3734-2 with an opening 3786 that exposes a via 3742. In one particular embodiment, such an action may include forming an insulating layer that may include, but is not limited to, silicon oxide, silicon nitride, silicon oxynitride, or some combination thereof. An opening may then be formed therein with photolithographic techniques.

FIG. 37B shows the formation of PMC element layers within an opening 3786, including optionally depositing a first electrode layer (3788), depositing an ion conductor layer (3790), depositing a second electrode layer (3792), and depositing a fill layer (3794). It is noted that a via 3742 may serve as an electrode, thus the step of forming first electrode (3788) may be optional (as the electrode may already exist below the opening 3786).

In the particular embodiment shown, a first electrode layer 3752, ion conductor layer 3754, second electrode layer 3756, and fill layer 3796 may be formed within opening 3786 of cell insulating layer 3784. Layers 3752, 3754, and 3756 may be the same as, and subject to the same variation as layers 3652, 3654 and 3656 described in FIG. 36D. Fill layer 3796 may be an insulating layer or a conductive layer (including a semiconductor layer).

FIG. 37C shows a planarization (3798) and non-oxidizing post planarization clean (3797). A planarization (3798) may include a chemical mechanical polishing that may planarize to a top surface of cell insulating layer 3784, as shown in FIG. 37C. A non-oxidizing post planarize clean (3797) may remove any residue resulting from a previous planarization step. Such actions may not expose a cell structure 3761 to an oxidizing atmosphere, thus preventing oxidation related defects from arising.

FIG. 37D shows the formation of a cap layer, in particular, a silicon nitride cap layer (3772) like that of FIG. 37G. However, as shown in FIG. 37D, due to the previous planarization step, a cap layer 3772 may be substantially planar. FIG. 37D also shows the formation of a low temperature passivation layer. In particular, a method 3700 may include forming an oxide with a low temperature decomposition of TEOS (3774), like that described in FIG. 36H. In addition or alternatively, such an action may include forming a low temperature cure polyimide (3776), like that described in FIG. 36G. FIG. 37D shows a passivation layer 3778 that may be substantially planar.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A programmable impedance element, comprising:
   a first electrode that extends through at least a first dielectric layer;
   a switching material and a second electrode formed within a cell opening of a cell insulating layer formed over the first dielectric layer, first portions of the switching material and second electrode being formed parallel to a bottom of the cell opening, and second portions of the switching material and second electrode being formed parallel to a side surface of the cell opening; and
   an insulating fill layer formed within the cell opening over at least a portion of the switching material and the second electrode, the insulating fill layer has a top surface substantially coplanar with a top surface of the cell insulating layer.

2. The programmable impedance element of claim 1, wherein:
   the switching material is selected from the group of: a chalcogenide and a transition metal oxide.

3. The programmable impedance element of claim 1, wherein:
   the second portion of the switching material is substantially perpendicular to the top surface of the first dielectric layer.

4. The programmable impedance element of claim 1, wherein:
   the second portion of the second electrode is substantially perpendicular to the top surface of the first dielectric layer.

5. The programmable impedance element of claim 1, further including:
   a conductive fill layer formed within the cell opening over at least a portion of the switching material and the second electrode.

6. The programmable impedance element of claim 5, wherein:
   the conductive fill layer has a top surface substantially coplanar with a top surface of the cell insulating layer.

7. A programmable impedance element, comprising:
   a first electrode that extends through at least a first dielectric layer;
   a switching material and a second electrode formed within a cell opening of a cell insulating layer formed over the first dielectric layer, first portions of the switching material and second electrode being formed parallel to a bottom of the cell opening, and second portions of the switching material and second electrode being formed parallel to a side surface of the cell opening; wherein
   the cell opening is a trench extending in a first direction parallel to first dielectric layer, the trench extending further in the first direction than a second direction perpendicular to the first direction; and
   a plurality of first electrodes having top surfaces in a bottom of the trench.

8. The programmable impedance element of claim 7, wherein:
   the switch layer is patterned to form a plurality of switch layer sections within the trench.

9. The programmable impedance element of claim 7, wherein:
   the second electrode is patterned to form a plurality of second electrode sections within the trench.

10. The programmable impedance element of claim 9, further including:
    a second electrode fill material formed in the trench over the second electrode sections.

11. A programmable impedance element, comprising:
    a first electrode that extends through at least a first dielectric layer;
    a switching material and a second electrode formed within a cell opening of a cell insulating layer formed over the first dielectric layer, first portions of the switching material and second electrode being formed parallel to a bottom of the cell opening, and second portions of the switching material and second electrode being formed parallel to a side surface of the cell opening;
    an insulating fill layer formed within the cell opening over at least a portion of the switching material and the second electrode; and
    a conductive fill layer formed within the cell opening over at least a portion of the switching material and the second electrode.

12. The programmable impedance element of claim 11, wherein:
    the switching material is selected from the group of: a chalcogenide and a transition metal oxide.

13. The programmable impedance element of claim 11, wherein:
    the second portion of the switching material is substantially perpendicular to the top surface of the first dielectric layer.

14. The programmable impedance element of claim 11, wherein:
    the second portion of the second electrode is substantially perpendicular to the top surface of the first dielectric layer.

15. The programmable impedance element of claim 11, wherein:

the insulating fill layer has a top surface substantially coplanar with a top surface of the cell insulating layer.

16. The programmable impedance element of claim 11, wherein:

the conductive fill layer has a top surface substantially coplanar with a top surface of the cell insulating layer.

\* \* \* \* \*